(12) United States Patent
Kamada et al.

(10) Patent No.: US 6,331,063 B1
(45) Date of Patent: *Dec. 18, 2001

(54) LED LUMINAIRE WITH LIGHT CONTROL MEANS

(75) Inventors: Kazuo Kamada, Hirakata; Shoichi Koyama, Kishiwada; Nobuyuki Asahi, Hirakata; Toshiyuki Suzuki, Nara; Eiji Shiohama, Katano; Masaru Sugimoto, Osaka; Shohei Yamamoto, Toyonaka; Jiro Hashizume, Hirakata; Taishi Akiniwa, Takatsuki; Takashi Tanaka, Osaka, all of (JP)

(73) Assignee: Matsushita Electric Works, Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/199,893

(22) Filed: Nov. 25, 1998

(30) Foreign Application Priority Data

| Nov. 25, 1997 | (JP) | 9-322626 |
| Nov. 25, 1997 | (JP) | 9-323550 |
| Nov. 25, 1997 | (JP) | 9-323551 |

(51) Int. Cl.[7] ............................................ F21V 7/04
(52) U.S. Cl. ..................... 362/237; 362/227; 362/235; 362/236
(58) Field of Search ................................ 362/800, 227, 362/235–237, 34, 84

(56) References Cited

U.S. PATENT DOCUMENTS

| 4,271,408 | * | 6/1981 | Teshima et al. | 340/702 |
| 4,467,193 | * | 8/1984 | Carroll | 250/216 |
| 4,935,665 | * | 6/1990 | Murata | 313/500 |
| 4,975,814 | * | 12/1990 | Schairer | 362/240 |
| 5,289,082 | * | 2/1994 | Komoto | 313/500 |
| 5,515,253 | * | 5/1996 | Sjoborn | 362/244 |
| 5,709,453 | * | 1/1998 | Krent et al. | 362/496 |

FOREIGN PATENT DOCUMENTS

| 1-283883 | 11/1989 | (JP) . |
| 4-92660 | 8/1992 | (JP) . |

* cited by examiner

Primary Examiner—Sandra O'Shea
Assistant Examiner—Ismael Negron
(74) Attorney, Agent, or Firm—Lynn & Lynn

(57) ABSTRACT

An LED luminaire is formed such that a plurality of LED chips are disposed three-dimensionally on an MID (molded interconnection device) substrate in a rectangular plate shape, by mounting three LED chips on bottom face of respective dents provided lengthwise and crosswise in one surface of the MID substrate, the LED chips including at least two types mutually diffferent in luminous color, desirably three types of red, blue and green colors. Any optional light distribution characteristic is made thereby easily obtainable depending on a configuration of the substrate, luminaire module can be thinned, and such delicate color difference as white color and day-light color of luminescent lamps is enabled by mixing the luminous colors of the respective LED chips.

13 Claims, 17 Drawing Sheets

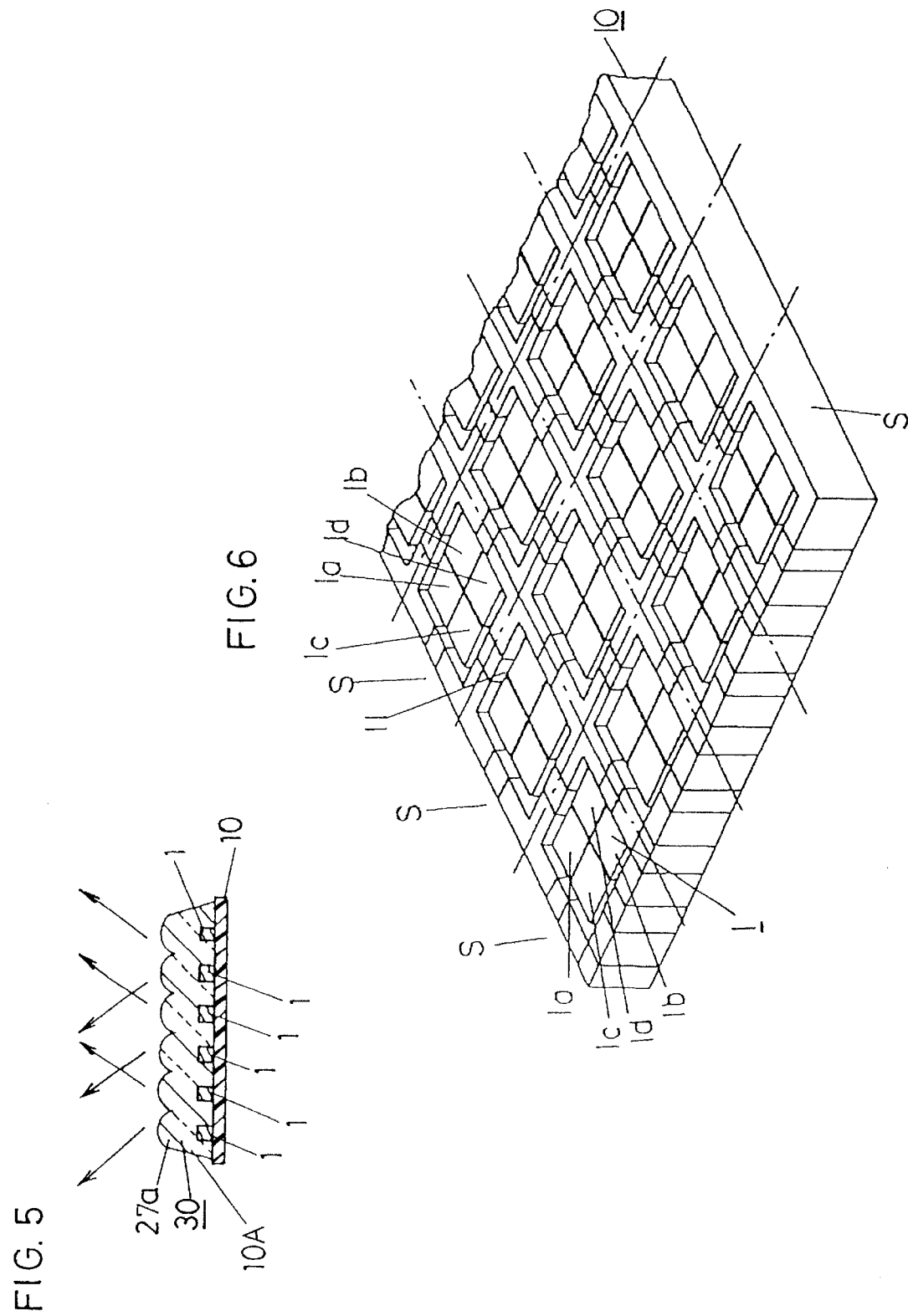

LIGHT EMITTING DIRECTION

LED LUMINAIRE WITH LIGHT CONTROL MEANS

BACKGROUND OF THE INVENTION

This invention relates to an LED luminaire formed with a plurality of light emitting diodes (LED) on a substrate.

DESCRIPTION OF RELATED ART

Conventionally, luminaires employing candescent lamp or luminescent lamp as light source have been radiating infrared and ultraviolet rays in addition to visible rays, and such other rays than the visible rays have been often affecting ill such objects irradiated as art objects, foodstuffs and so on. Further, in these luminaires, the light source, i.e., the lamp has its own life and is required to be exchanged for new one.

Recently, a light emitting diode (LED) of a high luminance has been suggested, and there have been used luminaires made not to radiate such harmful rays as the infrared, ultraviolet and the like rays, by means of such high luminance LED in a simple unit or, in particular, a modulation of a plurality of LED's mounted on an LED discrete substrate. These LED luminaires are advantageous in that the life is prolonged as compared with such light sources as the candescent and fluorescent lamps, the lamp exchange or the like maintenance is freed, and handling ability is excellent.

While the LED luminaires have such various advantages as in the above, they still have such drawbacks as will be referred to in the followings. That is, LED is of a single wavelength (single color) so as not to be able to obtain the white color, and LED is also strong in the directivity of light so that LED's of different wavelength (luminous color) and mounted on the same substrate as admixed will be unable to be mixed fully in their respective colors so as not to be able to easily obtain the white color light source but rather to cause, in particular, a shadow of the irradiated object to appear in rainbow colors. Accordingly, it is impossible to realize the delicate color difference between the white and daylight colors, as in the case of the luminaire employing the fluorescent lamp as the light source. Further, when LED's are mounted on the substrate at a high density, heat generation at the respective LED's will result in an elevated temperature, so as to render the luminous efficacy and luminance to be deteriorated, and the life of the respective LED's to be shortened. Since LED is large in its height dimension, further, it has been a remarkable trouble when the thinning of the device is intended.

For a related art of the kind referred to, a Japanese Utility Model Laid-Open Publication No. 4-92660 of Machida et al. discloses an LED luminaire in which LED's are arranged horizontally on a mounting plane of the substrate, with which arrangement, however, the light emitted by these LED's is limited only to be in vertical direction with respect to the mounting plane of the substrate, to be troublesome in the controllability of distribution of light. A Japanese Patent Laid-Open Publication No. 1-283883 of Ikeda discloses a resin molding of a substrate for mounting LED's but this substrate still has been unable to realize a desired control of the distribution of light.

SUMMARY OF THE INVENTION

An object of the present invention is to overcome the foregoing problems, and to provide an LED luminaire capable of easily attaining a desired distribution of light and of being thinned.

According to the present invention, this object can be realized by means of an LED luminaire comprising a substrate formed to have at least one of a plurality of dents and a plurality of protrusions, and a plurality of light emitting diodes disposed with respect to each of at least one of the plurality of the dents and a plurality of the protrusions.

Other objects and advantages of the present invention shall become clear as the description advances with reference to preferred embodiments of the invention shown in accompanying drawings.

BRIEF DESCRIPTION OF THE DRAWINGS

FIG. 5 is a fragmentary, schematic sectioned view of further embodiment of the present invention;

FIG. 6 is a perspective view similar to FIG. 2 of another embodiment of the present invention;

FIG. 15b is a front view of the embodiment of FIG. 15a;

FIG. 15c is a cross sectioned view of the embodiment of FIG. 15a;

FIG. 15d is a vertically sectioned view of the embodiment of FIG. 15a;

FIG. 21b is a fragmentary, schematic sectioned view of another embodiment of FIG. 21a;

FIG. 22b is a fragmentary, schematic perspective view of the aspect in FIG. 22a;

FIG. 24b is an explanatory view for the relationship between the wavelength and the intensity of light in the embodiment of FIG. 24a;

FIGS. 24 and 25 are fragmentary, schematic sectioned views respectively of another embodiments of the present invention;

Figure 1:
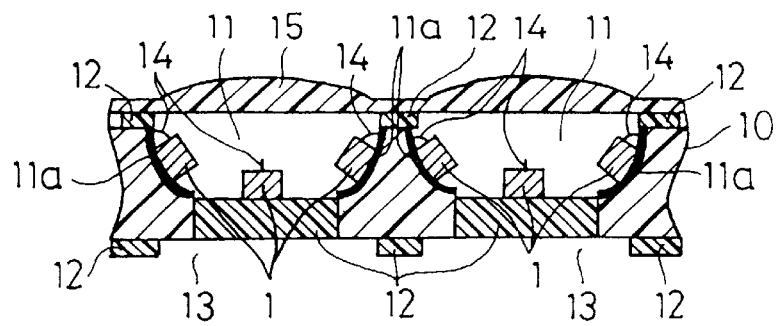
FIG. 1 is a sectioned view of the LED luminaire in an embodiment according to the present invention.

While the present invention shall now be described with reference to the respective embodiments shown in the drawings, it should be appreciated that the intention is not to limit the invention only to these embodiments shown but rather to include all alterations, modifications and equivalent arrangements possible within the scope of appended claims.

DETAILED DESCRIPTION OF THE PREFERRED EMBODIMENTS

Figure 2:
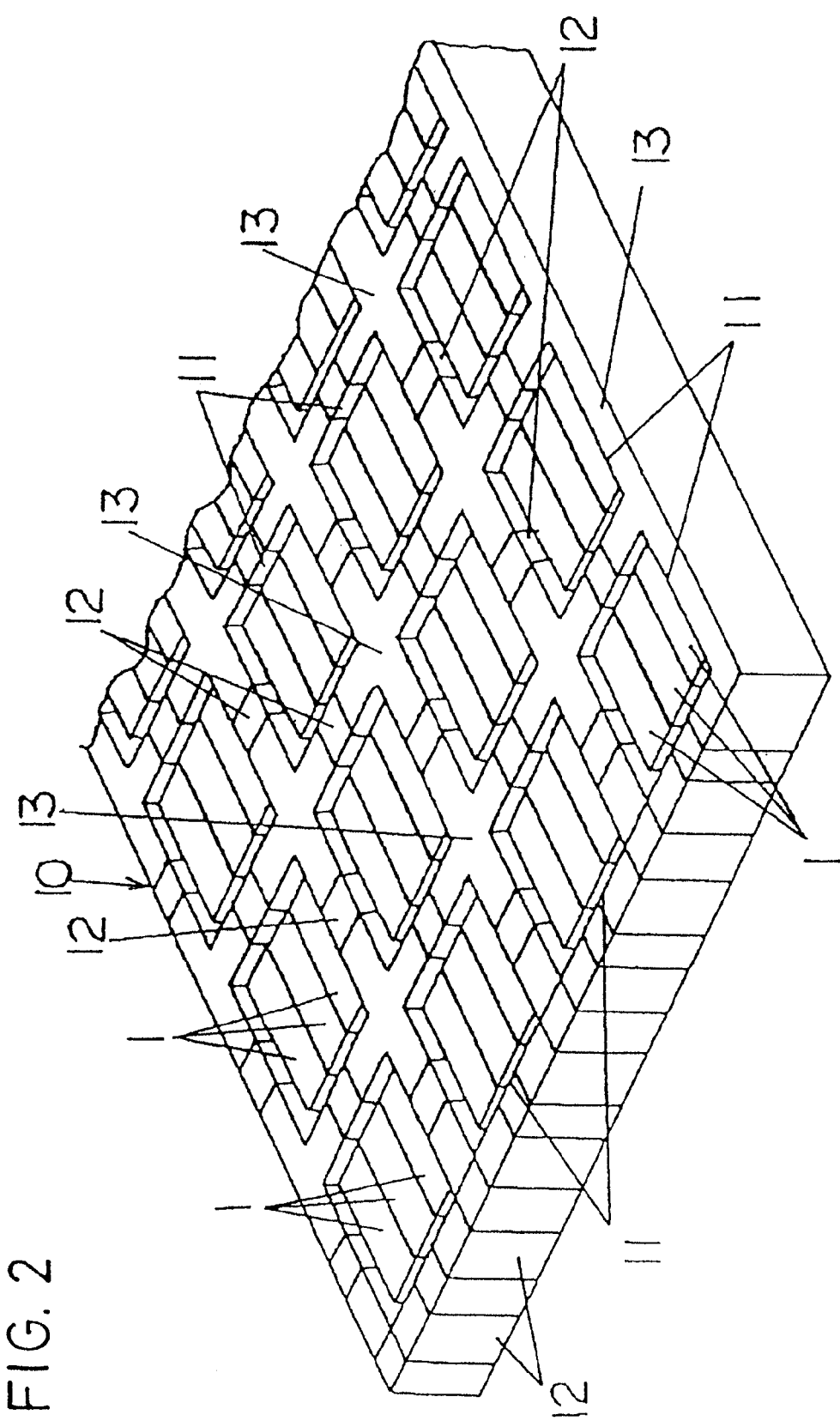
FIG. 2 is a perspective view of the luminaire in FIG. 1.

In FIGS. 1 and 2, there is shown an embodiment of the present invention, in which a three-dimensional circuit substrate 10 in the form of a molded interconnect device (MID) in a rectangular plate shape is formed to have in one surface many dents 11 arranged lengthwise and crosswise, and preferably three light emitting diode elements (which shall be hereinafter referred to as "LED chip") 1 are mounted to such part as bottom or side face or most part of, each dent 11.

Next, manufacturing steps of the above substrate 10 shall be described. An insulative base is formed through an injection molding with such electrically insulative material as polyimide, polyether imide, polyamide, liquid crystal polymer and the like, or ceramics, for example, $Al_2O_3$, SiC, $Si_3N_4$, $ZrO_2$ and the like, and the insulative base is made into a three-dimentional configuration by providing the dents 11 at mounting positions of the LED chips 1.

After subjecting this insulative base to an alkali degreasing, its surfaces are plasma-processed to activate the surfaces and to finely rougthen them. Thereafter, a metal film, that is, a plating ground layer of copper, silver, gold, nickel, platinum, paradium or the like is formed on the surfaces of the insulative base, by means of sputtering, vacuum evaporation or the like. This metal film should preferably be of a thickness of about 0.1 to 2.0 µm.

Then, such electromagnetic wave as laser or the like is radiated to partly remove the metal film. For this laser, a second harmonic generation YAG laser, YAG laser, excimer laser or the like is preferable. By scanning the laser beam by means of a galvanomirror, other parts than circuit parts 12 on which a circuit is formed on the surface of the insulative base, that is, non-circuit parts 13 forming insulating space between the circuit parts 12 are irradiated, and the metal film in boundary zone between the circuit parts 12 and the non-circuit parts 13 is to be removed by radiating the laser beam along a pattern of the non-circuit parts 13, with respect to at least the boundary zone of the non-circuit parts 13 with respect to the circuit parts 12.

Next, an electric copper plating is performed through, for example, a copper sulfate plating bath (copper sulfate 80 g/l, sulfuric acid 180 g/l, chlorine and a brightner) while supplying an electric power to the circuit parts 12, an electric nickel plating is performed with, for example, a Watts bath (nickel surfate 270 g/l, nickel chloride 50 g/l, boric acid 40 g/l and a brightner), an electric gold plating is performed with, for example, a liquid solution sold as TEMPEREX 401, a Japanese trademark of a firm Electroplating Engineers of Japan Ltd., and a circuit substrate on which metal films of a predetermined thickness, that is the three-dimensional circuit substrate 10 is obtained. Residual metal films at the non-circuit parts 13 may be removed as required, by means of a soft etching or the like.

The LED chips 1 are mounted in the dents 11 of the substrate 10 obtained through the foregoing process, and the circuit parts 12 and LED chips 1 are electrically connected (die-bonding) with an electrically conductive adhesive. Thereafter, top electrodes of the LED chips 1 and the circuit parts 12 are connected through gold wires 14 (wire-bonding). Inner surface 11a of the dents 11 in which the LED chips 1 are mounted is mirror-finished to render the dents to act also as a reflector, so that a high luminance and a high efficiency can be attained. Next, a transparent resin is charged in the dents 11 to seal the LED chips 1. At this time, the substrate 10 should preferably be provided with a dam for preventing the transparent resin from flowing out of the dents 11. Finally, a diffuser plate 15 consisting of a transparent resin is mounted to the surface, that is, the mounting surface of the substrate 10, and a module of the LED luminaire in the present embodiment is completed.

Since a plurality of the LED chips 1 are mounted in the dents 11 to dispose the chips in three-dimensional manner preferably on the three-dimensional circuit substrate 10 using the MID (molded interconnect device) it is enabled to easily attain the optional light distribution characteristic in accordance with the configuration of the substrate 10, and to render the module to be thinner than conventional ones in which many light emitting diodes of discrete type are disposed on the substrate. Further, by mounting at least two types of the LED chips 1 different in the luminous color, desirably three types of red, blue and green, it is made possible to realize such delicate color difference as that between the white and day-light colors in the case of the fluorescent lamp, with the light of the whole module by mixing the luminous colors of the respective LED chips 1.

While in the present embodiment the three-dimensional configuration is formed by providing the dents 11 in the substrate 10, the invention is not limited to this only but, for example, the substrate 10 may be provided with protrusions for mounting thereon the LED chips 1, or the substrate 10 may be formed in any one of various three-dimensional configurations, to dispose the LED chips 1 three-dimensionally.

In FIG. 2, the diffuser plate 15 made of the transparent resin is omitted for a clear illustration of the disposition of the LED chips 1 in the dents 11 for the entire luminaire as well as the relationship in the electrical connection between the LED chips 1 and the circuit parts 12. Further, the LED chips 1 are formed as molded with a transparent resin, for example, so as to be easy to accommodate in the dent 11.

Figure 3:
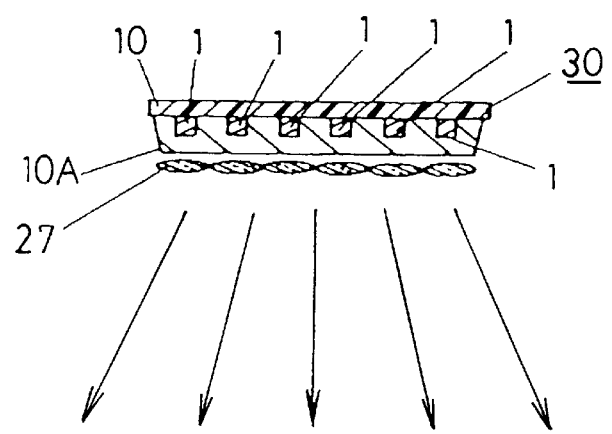
FIG. 3 is a fragmentary, schematic sectioned view of another embodiment of the present invention.

In FIG. 3, there is shown another embodiment of the present invention, in which the luminaire is constituted such that a plurality (for example, 100 pieces) of the LED chips 1 are mounted on a surface of the three dimensional circuit substrate 10 made of a resin (for example, 50×50 mm), a molded layer 10A of a transparent acrylic resin is formed on the surface of the substrate 10 to seal the LED chips 1, and a microlens plate 27 formed to have many microlenses as the optical control means for performing the light distribution control is disposed in consideration of the distribution of light of the entire LED luminaire 30 being made into a module, and the distribution of light is so set by the microlens plate 27 that light emitting angle of the entire LED luminaire 30 will be, for example, −60° to 60°.

Figure 4:
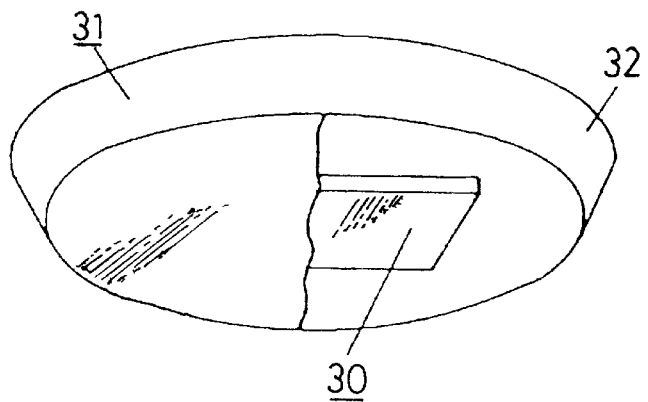
FIG. 4 is a perspective view of the luminaire employing the embodiment of FIG. 3, with part thereof shown as removed.

Referring also to FIG. 4 in addition to FIG. 3, an illumination appliance 31 employing the above LED luminaire 30 is disposed on the lower surface of an appliance body 32, and the lower surface of the body 32 is covered by a light transmitting lid. In the present embodiment, therefore, the light distribution control is enabled to be efficiently performed by disposing the plurality of LED chips on the single substrate 10, and the microlens plate 27 allows such light distribution control to be performable more efficiently, in conjunction with the light distribution control attained by controlling the direction of mounting of the LED chips 1.

In another embodiment shown in FIG. 5 of the present invention, in contrast to the microlens plate 27 formed separately from the molded layer 10A sealing the LED chips 1 in the embodiment of FIGS. 3 and 4, the molded layer 10A is formed to be provided on its surface with microlens section 27a as the optical control means for controlling the distribution of light of the respective LED chips 1, with the surface of the layer 10A spherically worked or worked into any optional configuration. Other constituents are the same as those in the embodiment of FIG. 3.

In this case, it is also possible to form the optical control means for a simultaneous light distribution control with respect to the light from a plurality (two to an optional number) of the LED chips 1, instead of attaining correspondence of the respective LED chips 1 to the optical control means. Accordingly, the light distribution control as shown by arrows can be realized by means of the microlens section 27a with respect to the light of the LED chips 1 in the LED luminaire 30 of the present embodiment.

Since the molded layer 10A of the sealing material is made integral with the microlens section 27a in the present embodiment, there is an advantage that any light loss occurs less to render the efficiency excellent, and the light distribution control as to the plurality of LED chips 1 is rendered easier.

On the other hand, there remains an inconvenience that, due to the mounting of many LED chips 1 onto the single substrate 10, the whole of the substrate 10 must be exchanged when even one or part of the LED chips 1 cannot be lighted because of, for example, failure occurring during the manufacturing steps or deterioration with age.

Now, in another embodiment shown in FIG. 6 of the present invention, the luminaire is featured in that a module with a combination of monochromatic LED chips 1a–1d of such four different colors as red, green, blud and yellow made as one unit is regarded as one cell S, and the LED luminaire is constituted by combining a plurality of the cells S.

Figure 7A:
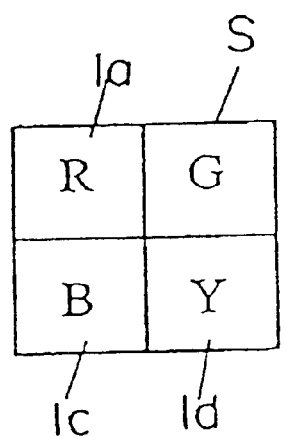
FIG. 7a is an explanatory view for the arrangement of 1 cell in the embodiment of FIG. 6.
Figure 7B:
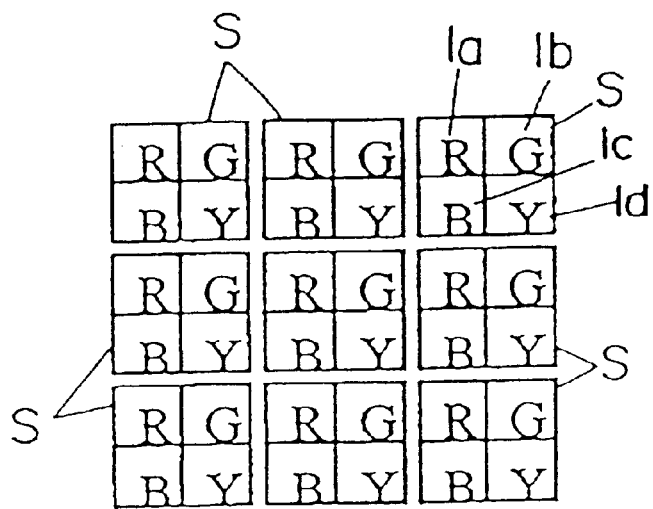
FIG. 7b is an explanatory view for the arrangement in a module comprising a plurality of cells in the embodiment of FIG. 6.

That is, the above LED chips 1a–1d of four colors are mounted as disposed in a matrix state to the respective dents 11 of the three-dimensional circuit substrate 10 which is sheet shaped as formed through the same process as in the embodiment of FIG. 1 (see also FIG. 7a). Each dent 11 in which the LED chips 1a–1d of four different colors are thus mounted is regarded as one cell S, and the cells S are cut into every cell at chain line portions in FIG. 6 by means of a dicing saw. Then each cell S thus cut is mounted again to a printed substrate or the like (see FIG. 7b).

According to the present embodiment as has been described, the LED luminaire is constituted such that each cell S containing the four LED chips 1 mounted in each dent 11 is made as one unit, and a plurality of such cells S are combined, so that, upon occurrence of non-lighted state at part of the LED chips 1 due to a failure apt to occur in the manufacturing steps or an inherent deterioration with age, only one cell S containing the particular non-lighted LED chip 1 may be exchanged with a good one, to allow the LED luminaire repaired at low costs. Further, by combining the cells S different in color mixing or light distribution characteristic, there arises an advantage that the LED luminaire for decoration use can be realized with a simpler arrangement.

Figure 8:
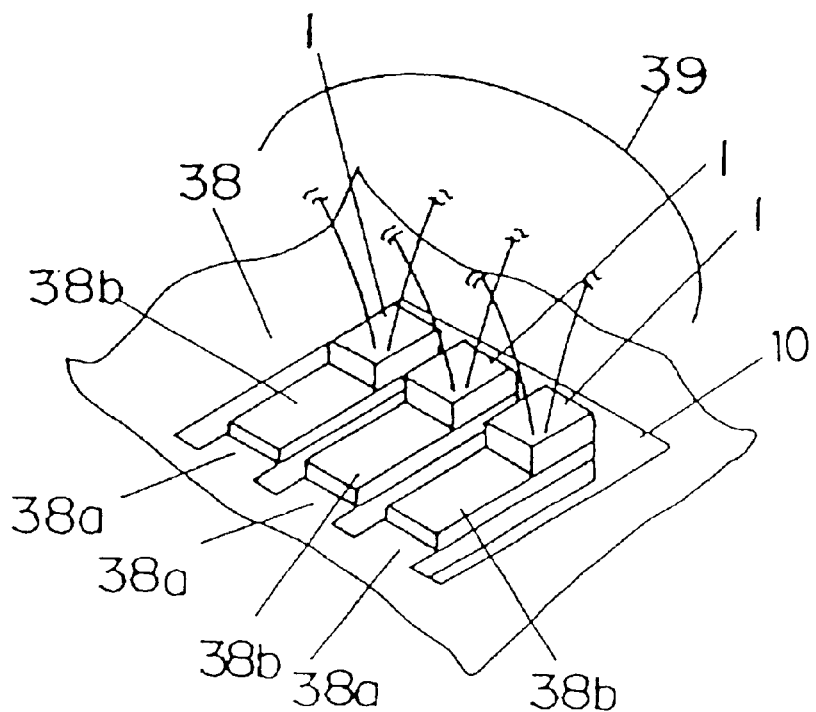
FIG. 8 is a fragmentary, schematic perspective view of further embodiment of the present invention.

In another embodiment shown in FIG. 8 of the present invention, the luminaire is featured in that means for a minute vibration of the LED chips 1, i.e., a micromachine section 38 in the present embodiment is provided to the MID substrate 10.

The micromachine section 38 is constituted by three beam sections 38a supported at one end in a cantilever form, and crystal plates 38b provided on the beam sections 38a, and the LED chips 1 are provided in the vicinity of respective free ends of the beam sections 38a. Further, a lens 39 should preferably be provided in front of the LED chips 1.

Next, manufacturing steps of the substrate 10 of the present embodiment are described only as to different respects from the embodiment of FIG. 1. The substrate 10 is the MID substrate made of a ceramic, for which a mixture as kneaded of, for example, alumina powder, a slip agent and a resin is injection molded, and thus molded article is degreased, dried and sintered to prepare a ceramic molded article (molded substrate). Thereafter, this molded substrate is alkali-degreased, and surfaces of the ceramic are plasma-processed for the surface activation and fine roughening. Then the metal film of copper, silver, gold, nickel, platinum, palladium or the like (plating ground layer) is formed on the surfaces of the ceramic through such proper process as sputtering, vacuum evaporation or the like. At this time, the metal film should preferably be of a thickness about 0.1–2.0 $\mu$m. Thereafter, the patterning is performed in the same manner as in the embodiment of FIG. 1, thin crystal plates 38b are mounted on the beam sections 38a, the LED chips 1 are mounted thereon, and the LED chips 1 are mounted thereon, to complete the LED luminaire module.

Then, with an application of a voltage to the micromachine section 38, the beam sections 38a can be vibrated because of a reverse piezoelectric effect of crystal, and it is enabled to cause the mounted LED chips 1 on the beam sections 38a to be finely vibrated.

Accordingly, it is possible to obtain optional color mixing and light distribution characteristic, by causing specific ones of the LED chips 1 finely vibrated, and also to improve flickering characteristic which gives to people an unpleasant feeling.

Figure 9:
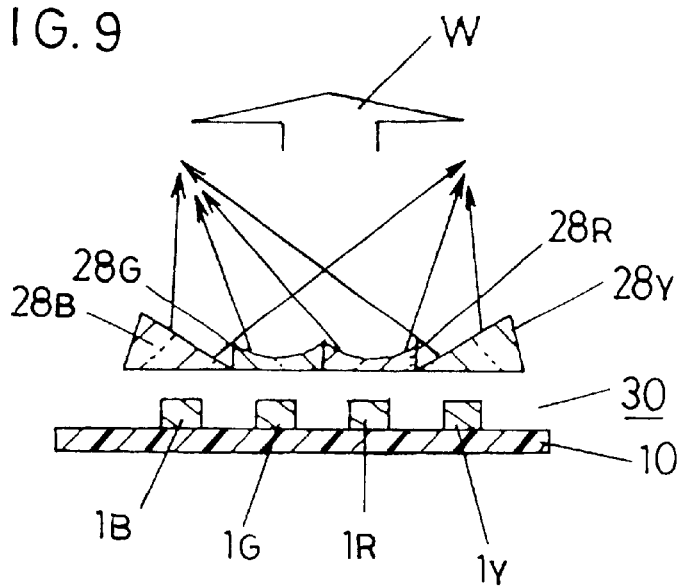
FIGS. 9–12 are fragmentary, schematic sectioned views showing other embodiments respectively of the present invention.

In causing a new light source to appear in place of the fluorescent lamp, on the other hand, there arises an event where an emission of white light close to the solar light is required. Pereceiving this respect, another embodiment of FIG. 9 arranges the LED chips 1 of different luminous colors to prepare a desired color with several types of colors blended, and the light distribution control is performed by the optical control means acting to blend the light of different colors.

That is, the modular LED luminaire 30 is constituted such that four LED chips 1 including, for example, an LED chip 1B emitting blue light, LED chip 1G emitting green light, LED chip 1R emitting red light and LED chip 1Y emitting yellow light are disposed on the resin-made substrate 10 at predetermined intervals, prisms 28B, 28G, 28R and 28Y corresponding respectively to the LED chips 1B, 1G, 1R and 1Y are disposed in front of the chips, and the respective colors of light from the respective LED chips 1B, 1G, 1R and 1Y are mixed at the central part of the substrate 10 through the light distribution control by means of the prisms 28B, 28G, 28R and 28Y into a white light W.

In the above embodiment, it is possible to obtain substantially white light W, which can be employed for various uses. In this case, it is also possible to obtain any optional color of light by controlling the distribution of light with such optical control means as the prisms or the like.

Figure 10:
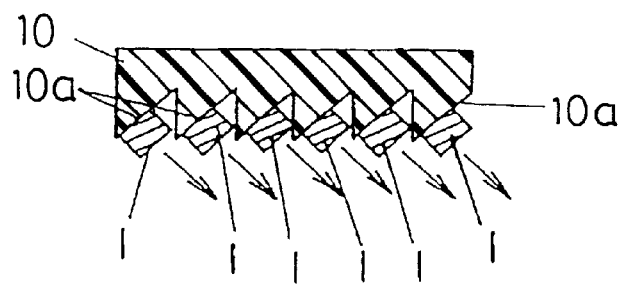

In another embodiment shown in FIG. 10 of the present invention, the luminaire is featured in that the substrate is formed to provide to the light emitting direction of the plurality of LED chips 1 a regularity, and, as seen in FIG. 10, the substrate 10 is formed to have a surface sawtoothed in section on the mounting surface side, and the LED chips 1 are mounted on slanted side faces 10a of respective saw-toothed ridges.

Generally, mounting direction to the substrate 10 and light emitting direction have the regularity, but it is possible to obtain desired characteristics of light distribution and light focusing, by forming the three-dimensional circuit substrate 10 in the MID form to be in an optional three dimensional configuration.

Since the completed module is so formed that the mounted LED chips 1 are faced regularly in one direction, there arises an advantage that the emitted light is distributed in one direction to improve the luminous efficiency.

According to the present embodiment as has been described, further, the substrate 10 is formed to provide the regularity to the light emitting direction of the plurality of LED chips 1, so that there arise advantage that the light distribution characteristic can be easily controlled in accordance with the configuration of the substrate 10, and that the utilization is made excellent by the light focusing and distribution taking into account the whole module. Further, as the light distribution can be controlled by means of the configuration of the substrate 10, such optical means as a lens is made unnecessary advantageously.

Further, in the above case, saw-tooth shaped slanted side faces 10a as the light control means may also be formed on the surface of the substrate 10 in a plurality, and the LED chips 1 are mounted on the slanted side faces 10a so as to render their p-n junction plane to be substantially vertical to sloped mounting surface of the slanted side faces 10a. As the LED chips 1 radiate the light in all direction in the p-n junction plane, the light radiated from the LED chips 1 is made substantially vertical to the surface of the slanted side faces 10a. Here, the surfaces of the slanted side faces 10a are formed to be mutually parallel, and therefore the emitted light of the respective LED chips 1 will be also mutually parallel, whereby it is enabled to radiate parallel light from the LED luminaire module, to improve the utilization of light.

Since in this way the surface of the substrate at positions where the LED chips 1 are mounted is formed in such three dimensional configuration preferably as the saw-tooth shape and so on taking into account the distribution of light in the case when the plurality of the LED chips 1 are disposed, it is enabled to render a provision of separate optical means unnecessary, and the light of the LED chips can be utilized highly efficiently.

Figure 11:
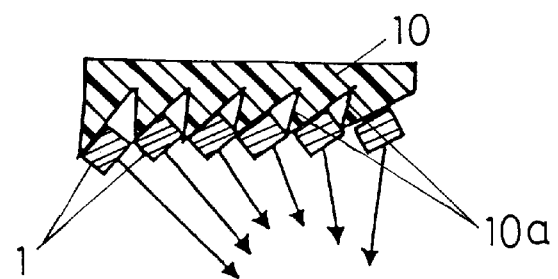

Further, in contrast to the embodiment of FIG. 10 in which the LED chips 1 are mounted on the slanted side face 10a of the substrate 10, the LED chips 1 will be so arranged, as shown in FIG. 11, that light emitting direction of the respective LED chips 1 will be turned in a specific direction or, for example, converged to an object. In this aspect, the luminaire can be remarkably improved in the light distribution characteristic and the light focusing characteristic with respect to an existing object or objective zone.

Figure 12:
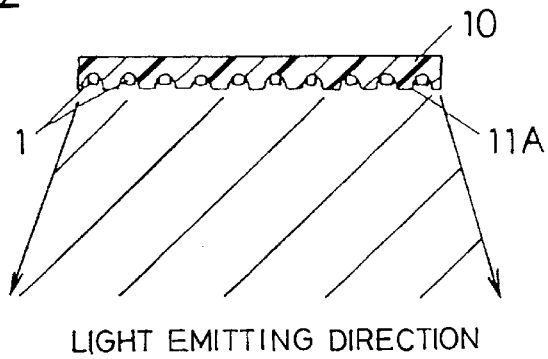

In FIG. 12, there is shown another embodiment of the present invention, in which the LED luminaire made in a module is so constituted that the substrate 10 carrying a plurality of the LED chips 1 per se is provided with a light control means 11A constituted by small continuous dents for controlling the light distribution of the respective LED chips 1, the light distribution of the LED chip 1 is thereby made controllable as desired without provision of any other optical means than the substrate 10, and the LED chip 1 is improved in the utilization of light.

Figure 13:
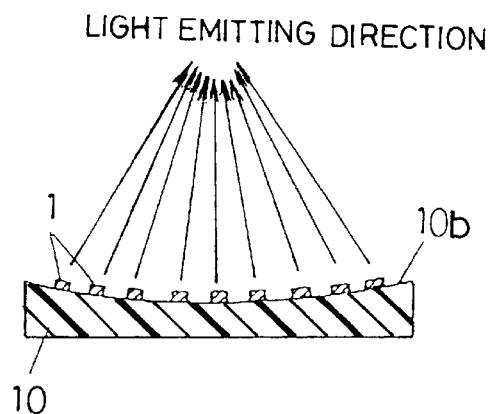
FIG. 13 is a schematic sectioned view of the embodiment of FIG. 12.

In another embodiment shown in FIG. 13, further, the LED luminaire is provided with a substrate 10 substantially of 50 mm in outer diameter in common, and a surface of the substrate 10 is polished to form a paraboloid 10b which functions as the light control means and also as a reflector surface. On the paraboloid 10b of this substrate 10, a plurlality of the LED chips 1 are mounted so that their p-n junction plane (boundary plane between p-type and n-type semiconductors) will be substantially vertical with respect to the paraboloid 10b. In this case, the LED chips 1 emit the light in all direction in the p-n junction plane, so that the light is radiated from the LED chips 1 substantially in vertical direction with respect to the paraboloid 10b, and the paraboloid 10a is so formed as to concentrate the emitted light of the respctive LED chips 1 to concentrate to a single point in the space.

Figure 14:
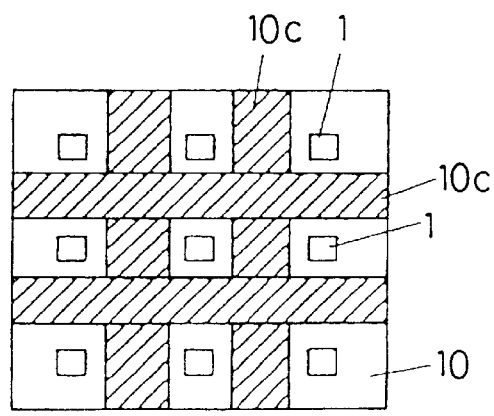
FIG. 14 is a schematic plan view of the embodiment shown in FIG. 10 of the present invention.

In another embodiment shown in FIG. 14 of the present invention, the luminaire is provided with the substrate 10, a plurality of the LED chips 1 mounted on the surface of the substrate 10 in a matrix shape, and a reflector surface 10c formed with, for example, aluminum film on the surface of the substrate 10 between adjacent ones of the LED chips 1. And in the present embodiment the aluminum film high in the reflection efficiency is employed for the reflector surface 10c, it is not necessary to limit the reflector surface 10c to be of the aluminum film, but any other metal material than the aluminum film and high in the reflection factor such as silver may be employed. Further, when an insulative substance is employed as the material for the reflector surface 10c, it is possible to avoid any danger of short-circuiting between the LED chips 1 or a wiring pattern (not shown) forming a lighting circuit for the LED chips 1 and the reflector surface 10c.

Generally, the LED chip 1 is to emit the light upon movement of electrons on the p-n junction plane with a current made to flow through the p-n junction in forward direction, and the light emitting direction will be in all direction in the p-n junction plane. Therefore, in an event where the LED chips 1 are disposed on the substrate 10 so that their p-n junction plane will be substantially vertical to the surface of the substrate 10, the light is radiated not only on the front side of the substrate 10 but also to directions parallel to the substrate 10 or in directions toward rear surface of the substrate 10. Due to this, an effective utilization of the emitted light of the LED chips 1 is limited when the surface of the substrate 10 only is attempted to be made into the three-dimensional configuration as in the embodiment of FIG. 14. Accordingly, by causing the radiated light from the LED chips 1 in substantially parallel direction with the substrate 10 to be reflected in a desired direction by the reflector surface 10c as the light control means, it is made possible to utilize not only direct light radiated from the LED chips 1 onto the front side of the substrate 10 but also the light radiated from the LED chips 1 can be utilized, the utilization of the emitted light of the LED chips 1 is elevated, and the intensity of light of the modular LED luminaire can be raised sufficiently.

Further, the reflector surface 10c may be formed three dimensionally so as to be able to reflect the light from the LED chips 1 in a desired direction. Also, the reflector surface 10c may be so formed that the direct light radiated from the LED chips 1 on the front side of the substrate 10 and the relfected light by means of the reflector surface 10c will be respectively radiated in different directions, and the LED luminaire can be increased in the variation of the light distribution.

While in the above embodiment of FIG. 14 the reflector surface 10c for reflecting the emitted light of the LED chips 1 in the desired direction is formed on the surface of the substrate 10, another embodiment shown in FIGS. 28a–28d of the present invention employs an arrangement in which the wiring pattern of the lighting circuit for the LED chips 1 formed on the surface of the substrate 10 is made to also act as the reflector surface 10c.

Figure 15A:
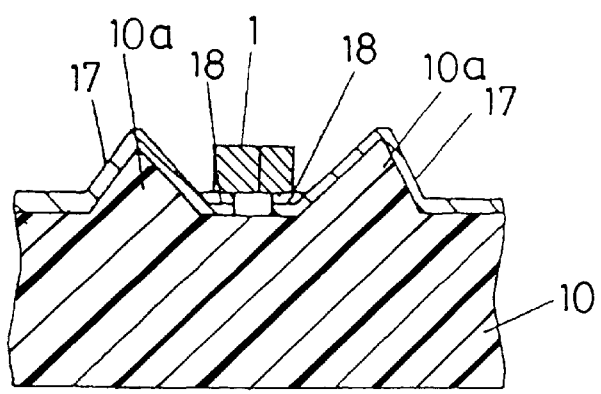
FIG. 15a is a fragmentary sectioned view as magnified of another embodiment of the present invention.
Figure 15B:
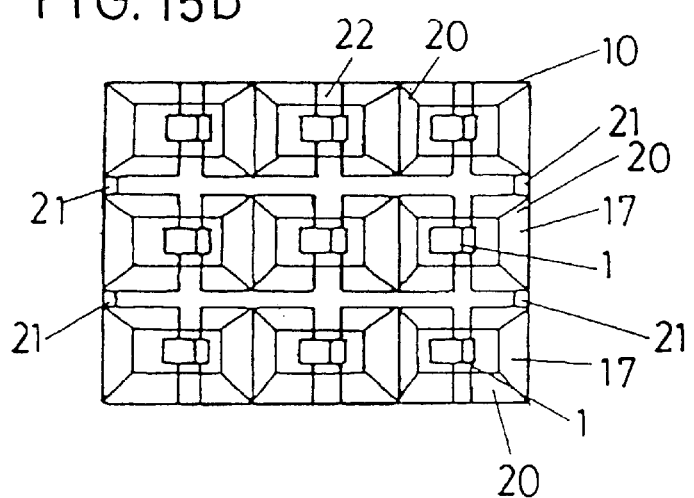
Figure 15D:
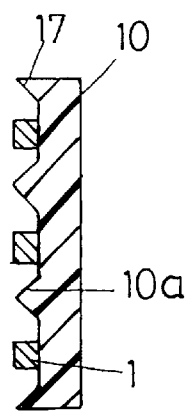
Figure 15C:
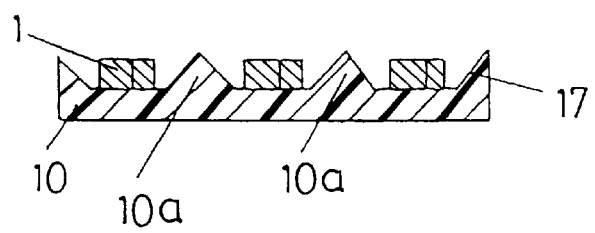

In this case, as shown in FIG. 15a, plated nickel layers 17 constituting the wiring pattern of the lighting circuit for the LED chips 1 are formed on the surface of the substrate 10. At end parts of the plated nickel layers 17, terminal sections 18 comprising a plated gold are are formed, and the p-type and n-type semiconductors of the respective LED chips 1 are mounted onto these terminal sections 18 with the soldering or electrically conductive paste employed. Further, as shown in FIG. 15b, three LED chips 1 are connected in series in forward direction through the plated nickel layer 17, and three of units 20 each comprising such three LED chips 1 are provided. The respective units 20 are mutually short-circuited at the plated nickel layers 17 on both side ends through short-circuit sections 21, and a circuit in which the three, series connected LED chips 1 are connected mutually in parallel is formed.

In this case, the LED chips 1 are mounted on the substrate 10 so that the p-n junction plane will be substantially vertical to the surface of the substrate 10, slanted side faces 10a are formed around the LED chips 1 mounted on the substrate 10 so as to protrude on the front side of the substrate 10 as separated from the LED chips 1, and the plated nickel layers 17 on the slanted side faces 10a are reflecting the emitted light from the chips in a desired direction.

As has been described, the LED luminaire of the present embodiment employs the plated nickel layers constituting the wiring pattern also as the reflector surface, so that the reflector or so is not required to be separately formed, the circuit design can be performed without taking into account the contact between the reflector surface and the wiring pattern, and the freedom of the design is made high. Further, in order to increase the reflected light by means of the plated nickel layers 17 as a whole of the modular LED luminaire, non-conductive sections 22 on the surface of the substrate 10 may be minimized in the surface area and the plated nickel layers 17 may be increased in the surface area.

Figure 16:
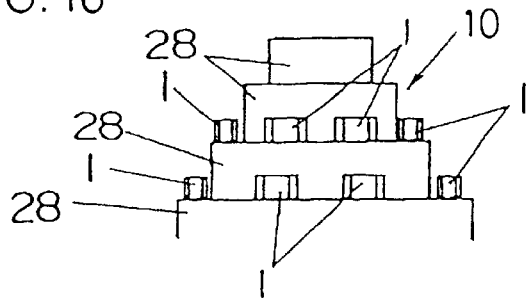
FIG. 16 is a fragmentary, schematic sectioned view of another embodiment of the present invention.

In another embodiment as shown in FIG. 16 of the present invention, the luminaire is featured in that the MID substrate 10 is formed to have sequential protrusions 28 in multilayers so as to be in a so-called tower configuration or a spiral configuration as a whole in which the protrusions 28 are raised sequentially to be higher towards the center, and a plurality of the LED chips 1 are disposed on the respective layers of such protrusions 28.

The substrate 10 is injection-molded using a mold made in the tower configuration. Following steps are in common with the embodiment of FIG. 1 and their description is omitted, except that the sealing with the synthetic resin is not performed after the mounting of the LED chips 1 to the substrate 10.

On the other hand, the power supply to the LED chips 1 causes temperature of the chips to rise and an ascending current to occur with ambient air of the chips warmed, the air thus ascends along the protrusions 28 of the substrate 10, while air at a lower temperature is caused to be introduced from lower part of the substrate 10 to drive the heat thereout and to cool it.

In the present embodiment as has been described, it is enabled to prevent the temperature rise from occurring in the LED chips 1 with the heat of the chips dispersed by means of an air current, i.e., a convection, since the whole body of the substrate 10 is made in the so-called tower or spiral configuration by the formation of the sequential protrusions 28 in multilayers on each layer of which the LED chips 1 are provided, whereby the luminous efficiency and luminance of the LED chips 1 can be prevented from being deteriorated, and the life of the chips can also be prolonged.

In an conventional discrete type light emitting diode, the epoxy resin for sealing the LED chips, for example, are formed into a cannon ball shape so as to act as a lens, to be able to radiate the light substantially in all direction of 360°, whereas, in the case where a plurality of light emitting diodes are to be mounted on the substrate, the light radiation in all radial directions is made difficult due to the interception of the substrate.

Figure 17:
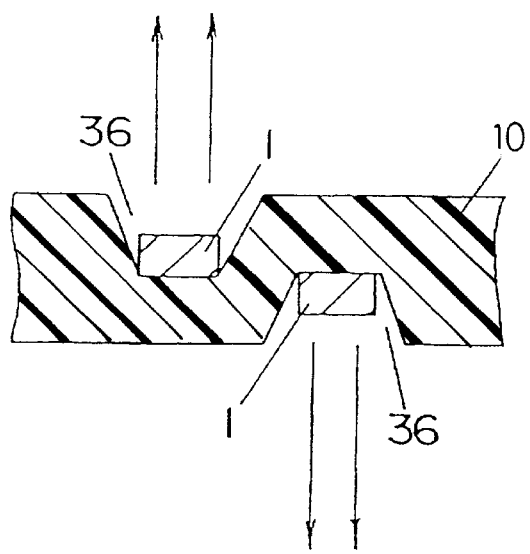
FIG. 17 is a fragmentary, schematic side view of another embodiment of the present invention.

In another embodiment shown in FIG. 17 of the present invention, the luminaire is featured in that a plurality of dents 36 are formed in both side surfaces of the MID substrate 10, and the LED chips 1 are mounted to the bottom of the respective dents 36, so that the light can be radiated substantially in all circumferential directions of the substrate 10. Manufacturing steps for this substrate 10 are the same as in the embodiment of FIG. 1 and their description is omitted.

According to the present embodiment as described above, a plurality of the dents 36 are formed in each of both side surfaces of the substrate 10 and the LED chips 1 are mounted to the bottom of the respective dents 3, so that the light can be radiated substantially in all directions, and the luminaire can be used in similar manner to the conventional fluorescent and candescent lamps. Further, with mounting density of the LED chips 1 with respect to the substrate 10 increased, there arise advantages that the entire luminance can be improved, and further that the design freedom of the light distribution is enlarged.

Figure 18:
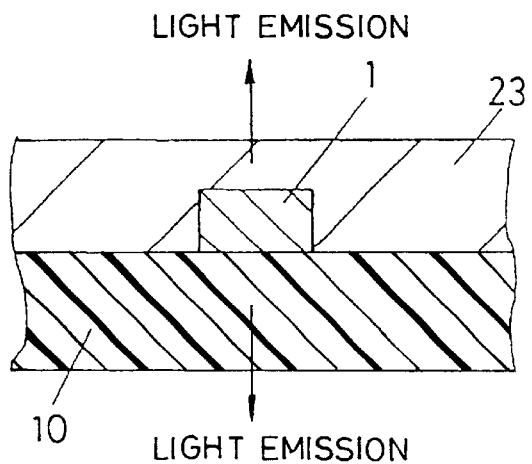
FIGS. 18 and 19 are fragmentary sectioned views as magnified of respective further embodiments of the present invention.

Further, as, the LED chip 1 emits the light in all direction in the plane of the p-n junction, the light emitted from the LED chips 1 towards the substrate 10 is intercepted by the substrate 10 in the event where the LED chips 1 are disposed on the substrate 10 to position the p-n junction plane substantially vertical to the surface of the substrate, even though various configurations of the substrate 10 and mounting direction of the LED chips 1 are observed, and it is difficult to utilize all emitted light of the LED chips 1. In another embodiment as shown in FIG. 18 of the present invention, therefore, a light transparent resin is employed as the material of the substrate 10 for mounting the LED chips 1, so that the light radiated to the side of the substrate 10 can be utilized as transmitted to the other side of the substrate 10.

That is, the luminaire is constituted by the substrate 10 formed with a transparent acrylic resin, LED chips 1 disposed on the substrate 10 to position the p-n junction plane substantially vertical to the surface of the substrate 10, and transparent sealing 23 formed on the surface of the substrate 10 for protecting the LED chips 1. While in this case the acrylic resin is employed for the material of the substrate 10, the material is not required to be limited to the acrylic resin but may be such transparent resin as polycarbonate or the like other than the acrylic resin.

Now, with the use of the light transparent material for the substrate 10 and sealing 23, the light emitted from the LED chips 1 towards the substrate 10 is transmitted through the substrate 10 to be radiated to the exterior on the rear surface side of the substrate 10, and the light radiated on the front surface side of the substrate 10, i.e., on the sealing 23 side is transmitted through the sealing 23 to be radiated to the exterior. Accordingly, the light control means is constituted by the substrate 10 formed with the light transparent resin per se, so that the light radiated on the front side as well as the light radiated on the rear side of the substrate 10 can be utilized, and the utilization of the light of the LED chips can be elevated. While in the present embodiment the substrate 10 as a whole is formed by the transparent resin, it is possible to form the substrate 10 with the transparent resin only at portions where the LED chips 1 are mounted.

Figure 19:
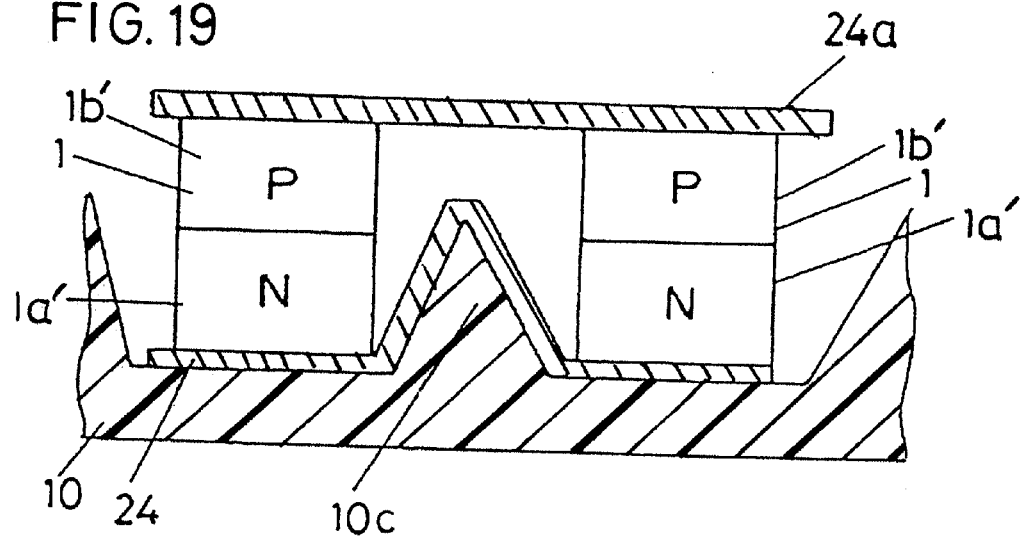

In order to electrically connect the LED chips 1 mounted on the substrate 10 to the wiring pattern formed on the substrate 10, it is required to provide on the LED chips 1 an electrode section made of such metal material as aluminum and to connect this electrode to the wiring pattern on the substrate 10 by means of bonding wire, whereas there remains a problem that, as the electrode section formed on the LED chips is not transmissive to the light, the emitted light of the LED chips 1 is intercepted by such electrode section, and a shadow is cast. In another embodiment shown in FIG. 19, on the other hand, a transparent, electrically conductive member having the light transmission properties is employed for the electrode section for power supply to the LED chip, and the emitted light of the LED chips 1 can be prevented from being intercepted.

Accordingly, the luminaire comprises the substrate 10 made of a resin which does not transmit light, an electrode section 24 formed on the surface of the substrate 10, a plurality of the LED chips 1 mounted on the electrode section 24, and a further electrode section 24a provided on the top of the respective LED chips 1, wherein the electrode sections 24 and 24a are both formed with indium-tin oxide (ITO) which is a transparent conductor. In this case, the n-type semiconductors 1a' of the respective LED chips 1 are electrically connected to the one electrode section 24 and the p-type semiconductors 1b are electrically connected to the other electrode section 24a. Further, the electrode section 24 is electrically connected to the wiring pattern (not shown) formed on the substrate 10, while the electrode section 24a is electrically connected through a bonding wire (not shown) to the other wiring pattern formed on the substrate 10. Thus, the LED chips 1 are connected through the electrode sections 24 and 24a to the wiring patterns. Further, protrusions 10d are formed on the substrate 10 to be between adjacent ones of the LED chips 1, the light radiated from the p-n junction plane of the LED chips 1 is reflected on the protrusions 10d of the substrate 10 and is radiated in a direction of desired light distribution.

Since the transparent electrode sections 24 and 24a are employed for electrically connecting the LED chips 1 to the wiring pattenrs, the emitted light of the LED chips 1 is not intercepted by the electrode sections 24 and 24a, so that the utilization of the light of the LED chips 1 can be improved, and any loss of the emitted light can be reduced.

While in the present embodiment ITO is employed for the electrode sections 24 and 24a, they may not be limited to ITO, but such other transparent conductor than ITO as cadmium-tin oxide (CTO) or the like may be used. Further, with a use of a substrate of light transmission properties as the substrate 10, the emitted light of the LED chips 1 can be prevented from being intercepted, and the utilization of the emitted light of the LED chips 1 is further improved.

Figure 20:
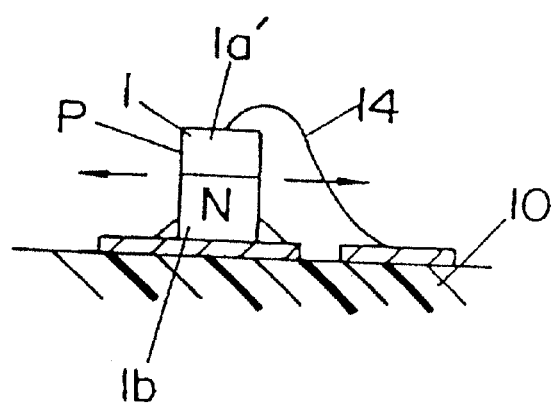
FIG. 20 is an explanatory view for the operation of another embodiment of the present invention.

On the other hand, the LED chip 1 emits light upon movement of electrons at junction boundary plane between P-type semiconductor 1a' and N-type semiconductor 1b', which light is radiated in all directions in a plane including the junction boundary plane, while it is apprehended that the light is intercepted in the direction in which the LED chip is mounted to the substrate 10 or by the metal wire 14, so that the radiating direction of light is restricted and shadows are cast (see FIG. 20).

Figure 21A:
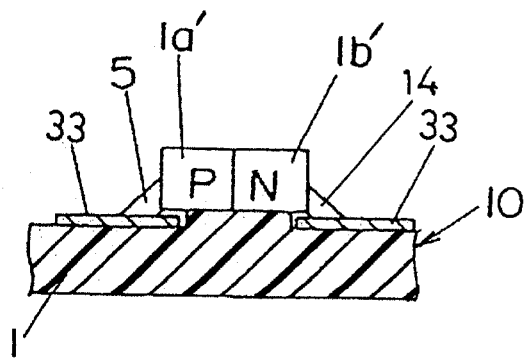
FIG. 21a is a fragmentary, schematic sectioned view of another embodiment of the present invention.
Figure 21B:
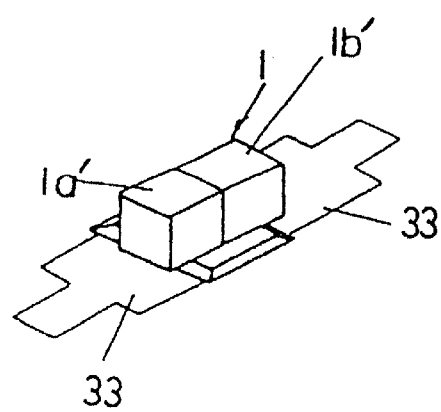

Here, in the present embodiment, the luminaire is featured in that, as shown in FIGS. 21a and 21b, the LED chip 1 is disposed to position the P-type and N-type semiconductors 1a' and 1b' to be in a row substantially vertical to the mounting surface of the substrate 10. Other respects in the arrangement are the same as in the embodiment of FIG. 1 and their description is omitted here.

As shown in FIGS. 21a and 21b, in this case, the part of the substrate where the LED chip 1 is mounted is raised one stage from surrounding part, pads 33 are provided on both sides of the raised parts, and the connection of these pads 33 to the P-type and N-type semiconductors 1a' and 1b' of the LED chip 1 is performed by means of soldering or the electrically conductive adhesive. Here, as the LED chip 1 is mounted onto the raised part, so that any short-circuit trouble can be prevented from occurring at the time of such connection. For the LED chip 1, one of a cube of 0.3 mm, for example, is desirable.

According to the present embodiment as has been described, the LED chip 1 is disposed to position the P-type and N-type semiconductors 1a' and 1b' in the row substantially to be parallel with the mounting surface of the substrate 10, so that the junction plane of both semiconductors will be substantially orthogonal to the surface of the substrate 10, the emitted light from the LED chip 1 is radiated in the direction vertical to the substrate 10, whereby the metal wires 14 are made not to intercept the light so as not to cast any shadow, and the luminous efficiency of the LED chip 1 can be elevated.

Figure 22A:
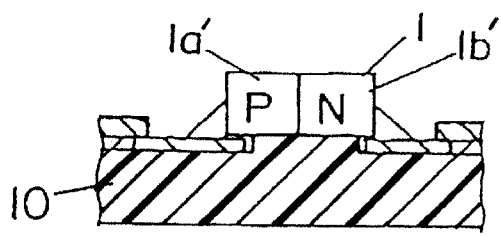
FIG. 22a is a fragmentary, schematic sectioned view in another aspect of the above.
Figure 22B:
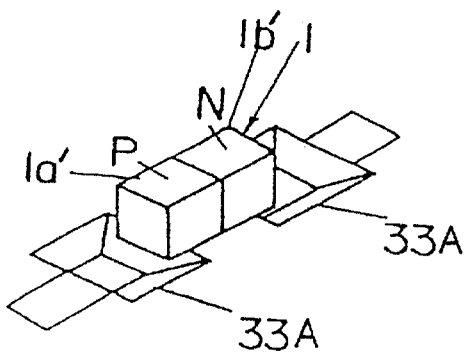

Further, as shown in FIGS. 22a and 22b, by a provision of recesses 33A at fillet portions to join the LED chip 1 with the insulative adhesive or the like performed within the recesses 33A, the short-circuiting upon the electric connection can be also prevented from occurring.

Accordingly, by the disposition of the LED chips 1 so as to dispose the P-type and N-type semiconductors 1a and 1b in the row substantially vertical with the mounting surface of the substrate 10, the light emitting direction of the LED chip 1 can be rendered substantially vertical with the substrate 10, the metal wires 14 are caused not to cast any shadow, and the LED chip can be increased in the luminous efficiency.

Figure 23:
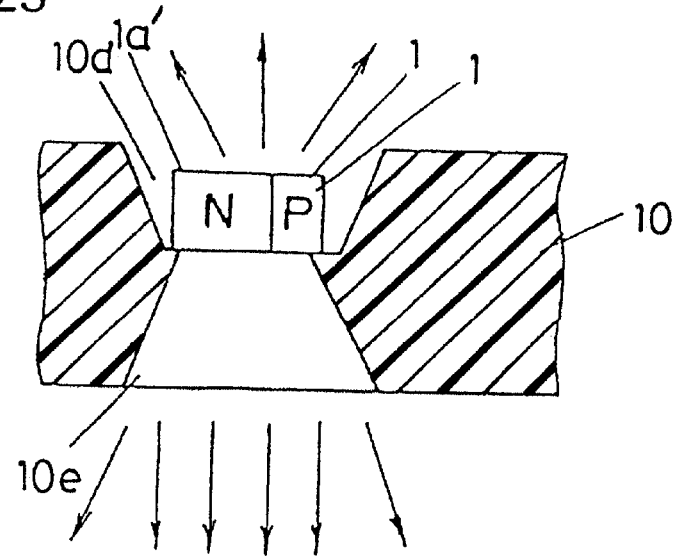
FIG. 23 is a fragmentary sectioned view as magnified of further embodiment of the present invention.

In another embodiment shown in FIG. 23 of the present invention, the luminaire comprises the substrate 10, and the LED chips 1 disposed in respective dents 10e formed in the surface of the substrate 10, and a through hole 10f is formed as a light control means as penetrating through the substrate 10 at positions where the respective dents 10e are formed.

The LED chips 1 are disposed to position the p-n junction plane substantially vertical to the surface of the substrate 10, and the n-type and p-type semiconductors 1a' and 1b' of the respective LED chips 1 are electrically connected to the wiring patterns (not shown) formed on the substrate 10 respectively. As the LED chips 1 emit light in all direction in the p-n junction plane, so that part of the emitted light of the LED chips 1 will be radiated on the front surface side of the substrate but the rest will be radiated to the rear surface side of the substrate 10 through the penetrating hole 10f, and the light can be radiated on both sides of the substrate 10.

Here, a combined use of LED chips (not shown) disposed on the front surface of the substrate 10 to position the p-n junction plane in parallel to the surface of the substrate 10 for radiating light emitted from the p-n junction plane on the front side as reflected on the substrate 10, with the LED chips 1 mounted on the substrate 10 in the orientation as shown in FIG. 23 for the radiation of light onto both sides of the substrate 10, allows the luminaire to radiate the light to both sides of the substrate 10.

A reflecting material is applied to the inner walls of the penetrating holes 10f, so that the light from the LED chips 1 can be prevented from being absorbed by the substrate 10.

Figure 24A:
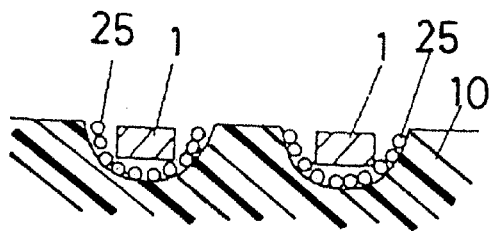
FIG. 24a is a fragmentary, schematic sectioned view of another embodiment of the present invention.

Since the emission of the LED chips 1 is normally a monochromatic light, further, it is required to mix a plurality of luminescent colors for obtaining such white light as solar light. Taking into account this respect, the white light is obtained in another embodiment shown in FIGS. 24a and 24b, by utilizing the emission of fluorescent substance and mixing the emission of the LED chips 1 with the emission of the fluorescent substrate.

That is, a luminaire is constituted by the substrate 10, the dents 10d formed in a surface of the substrate 10, a fluorescent substance 25 applied to inner surface of the dents 10e, and the LED chips 1 mounted in the respective dents 10e.

Figure 24B:
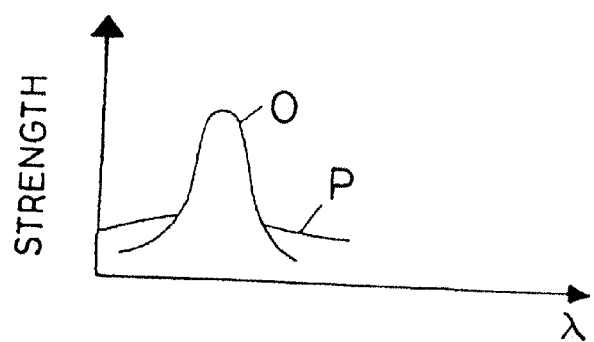

As shown in FIG. 24b, the emission spectrum P of the fluorescent substance 25 is not identical with but rather different from the emission spectrum 0 of the LED chips 1, so that, a light which is different from the light of the LED chips 1 can be obtained by mixing the light of the LED chips 1 with the light of the fluorescent substance 25 with the latter applied to the positions on the substrate 10 where the LED chips 1 are mounted, and the white light can be obtained depending on the light of the fluorescent substance 25. Because the LED chips 1 and the fluorescent substance 25 are different in the emission luminance, an optimum filter (not shown) may be provided on the surface of the LED chips 1 for adjusting the emission luminance. Further, as an intimate relationship is present between the emission colors of the LED chips and fluorescent substance 25, it may suffice the purpose of controlling the emission color of the LED luminaire as a whole to employ the LED chips 1 which emits ultraviolet or infrared rays.

Figure 25:
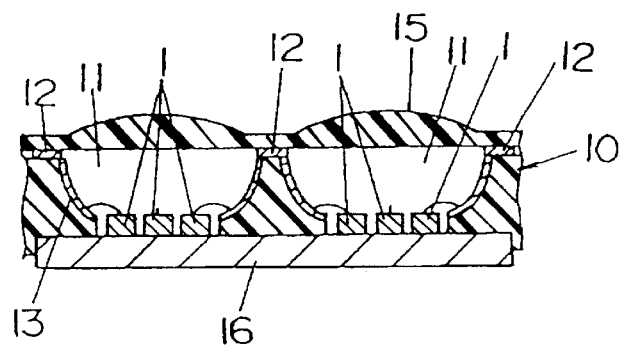

In FIG. 25, another embodiment of the present invention is shown, in which a metal plate 16 acting as a ground of the circuit including the LED chips 1 is provided on rear surface (opposite side of mounting surface) of the substrate 10, the LED chips 1 are mounted on the metal plate 16 (of, for example, copper) at portions exposed at the bottom of the dents 11, so as to be featured in the arrangement where the heat generated by the LED chips 1 can be highly efficiently radiated through the metal plate 16. Since other respects of the arrangement are substantially the same as those of the embodiment of FIG. 1, and their description is omitted here with the same constituents as those in FIG. 1 denoted by the same reference symbols in FIG. 25.

Next, manufacturing steps of the substrate 10 in the present embodiment shall be described only for different respects from the embodiment of FIG. 1. The metal plate 16 of a proper size and shape is placed in a mold, and an insulative base is formed by means of an insert injection molding. As the electrically insulating material, polyimide, polyether imide, polyamide, liquid crystal polymer or the like is used similar to the embodiment of FIG. 1. The metal plate 16 may be preliminarily formed in a three-dimensional configuration through a sheet-metal working, machine working, chemical etching or the like.

Here, the metal plate 16 is exposed at the foregoing bottom of the dents 11 in which the LED chips 1 are mounted, by so disposing the metal plate 16 in the bottom simultaneously with the molding, or by removing the molded resin by means of the laser or honing after the molding. After alkali-degreasing the insulative base, the metal plate 16 is subjected at its surfaces to a chemical etching in order to activate the plate. Next, the surfaces of the insulative base are plasma-processed to perform the surface activation and fine surface roughening. Thereafter, similar to the embodiment of FIG. 1, the metal layer is formed to provide the circuit parts 12 and non-circuit parts 13, eventually the LED chips 1 are mounted in the dents 11 and are sealed by the transparent resin, and the diffuser plate 15 is mounted to the mounting side of the substrate 10 to complete the module of the LED luminaire.

According to the present embodiment, as has been described, the metal plate 16 and LED chips 1 are brought into direct contact with each other by mounting the LED chips 1 to the metal plate 16 with the metal plate 16 made as a common ground of the circuit, so that the heat generated by the LED chips 1 can be radiated and removed through the metal plate 16. For this reason, it is enabled to prevent the temperature of the LED chips 1 from rising, to prevent the luminous efficiency and luminance from being deteriorated, and to extend the life of the LED chips 1.

Figure 26:
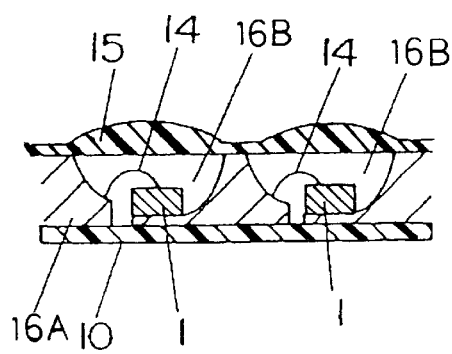
FIG. 26 is a fragmentary, schematic sectioned view of further embodiment of the present invention.
Figure 27:
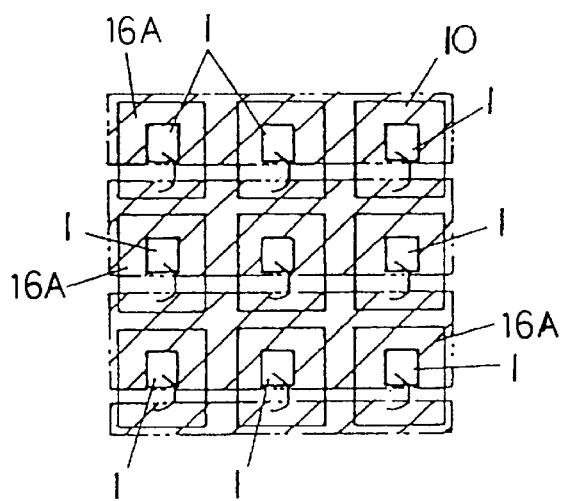
FIG. 27 is a schematic plan view of the embodiment of FIG. 26.

In another embodiment shown in FIG. 26 of the present invention, the luminaire is featured in that a heat emitter 16A consisting of a metal and reflecting light is disposed around the LED chips 1, and this heat emitter 16A of the LED chips 1 is made to be used also as the reflector (see also FIG. 27). Since other respects of the arrangement are substantially the same as those in the embodiment of FIG. 1, the same constituents as those in FIG. 1 are denoted in FIGS. 26 and 27 by the same reference symbols to omit their description.

Next, manufacturing steps of the substrate 10 in the present embodiment shall be described only for different respects from the embodiment of FIG. 1. The heat emitter 16A (for example, a copper plate) of proper dimensions and configuration is placed in the mold to form the insulative base through the insert injection molding. For the electrically insulative material, similar to the foregoing embodiments, polyimide, poyether imide, polyamide, liquid crystal polymer or the like is used. The heat emitter 16A is preliminarily formed in a three-dimensional configuration (a configuration in which many dents 16B for mounting the LED chips 1 are disposed, concretely) suitable as the reflector, by means of the sheet metal working, machine working, chemical etching or the like.

After degreasing this insulative base, a chemical etching is performed with respect to surfaces of the heat emitter 16A to activate them. Next, the surfaces of the insulative base are plasma-processed for their activation and fine roughening. Thereafter, the metal layers are formed to provide the circuit parts 12 and non-circuit parts 13, eventually the LED chips 1 are mounted in the dents 16B of the heat emitter 16A and are sealed by the transparent resin, and the LED luminaire module can be completed by mounting the diffuser plate 15 on the mounting side of the substrate 10.

According to the present embodiment, as has been described, the heat emitter 16A and LED chips 1 are brought into direct contact with each other by disposing the heat emitter 16A acting also as the reflector around the LED chips 1, so that the heat generated at the LED chips 1 can be removed as efficiently emitted through the heat emitter 16A. For this reason, it is enabled to prevent the temperature of the LED chips 1 from rising, to prevent the luminous efficiency and luminance from being deteriorated, and to extend the life of the LED chips 1.

Figure 28:
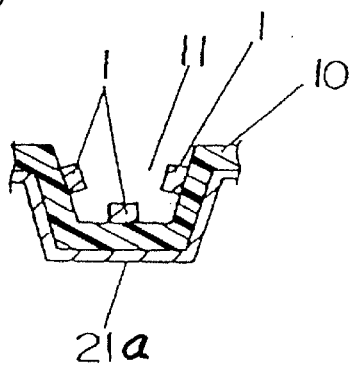
FIGS. 28–33 are fragmentary, schematic sectioned views respectively of further embodiments of the present invention.

In another embodiment shown in FIG. 28, the luminaire is featured in that the MID substrate 10 is formed on one surface of a metal plate 21a in the form of a heat emitter provided with dents and protrusions on the surfaces, and the LED chips 1 are mounted to the bottom and side surfaces inside each of the dents 11 formed in the substrate 10 in conformity to the dents and protrusions of the metal plate 21a.

Manufacturing steps of the substrate 10 in the present embodiment shall be briefly described next. The metal plate 21a of, for example, copper having the dents and protrusions in its surfaces is placed in a mold, and the substrate 10 is formed on the plate by means of the insert injection molding. For the electrically insulating material of the substrate, polyimide, polyether imide, polyamide, liquid crystal or the like is employed, likewise the embodiment of FIG. 1. The metal plate 21a is preliminarily formed in the three-dimensional configuration having the dents and protrusions by means of the sheet metal working, machine working, chemical etching or the like (more concretely, many of the dents 11 for mounting the LED chips 1 are formed).

After alkali-degreasing the above substrate molded, the metal plate 21 chemically etched to activate its surfaces. Then, the three-dimensional circuit substrate 10 of insulating material 10 is plasma-processed for surface activation and fine roughening. Thereafter, the metal layer is formed to provide the circuit parts 12 and non-circuit parts 13. Eventually, the LED chips 1 are mounted within the dents 11 of the substrate 10 and are sealed with the transparent resin, and the diffuser 15 is mounted on the chip mounting side of the substrate 10 to complete the LED luminaire module.

According to the present embodiment as has been described, the heat generated by the LED chips 1 can be removed as emitted efficiently by means of the increased surface area of the metal plate 21 by the provision of the dents and protrusions in the surfaces, whereby the temperature of the LED chips 1 can be prevented from rising, the luminous efficiency and luminance can be prevented from being deteriorated, and the life of the LED chips 1 can be prolonged.

Figure 29:
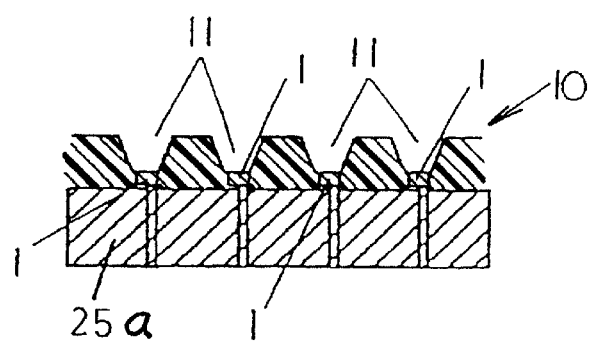

In another embodiment shown in FIG. 29 of the present invention, the luminaire is featured in that a heat emitting fin 25a contacting at least with part of the LED chip 1 is provided. The heat emitting fin 25 is formed by means of an aluminum die casting and is inserted in a mold to be made integral with the substrate 10 through the insert injection molding. For the electrically insulating material, polyimide, polyether imide, polyamide, liquid crystal or the like is used, likewise the embodiment of FIG. 1. The thus molded substrate is alkali-degreased, and thereafter the heat emitting fin 25a is chemically etched at the surfaces to activate them. Then the surfaces of the insulative substrate are plasma-processed for their activation and fine roughening. Thereafter, the metal layer is formed to provide the circuit parts 12 and non-circuit parts 13. Eventually, the LED chips 1 are mounted in the respective dents 11 of the substrate 10 and are sealed by the transparent resin, and the diffuser 15 is mounted on the chip mounting side of the substrate 10 to complete the LED luminaire module. Here, the LED chips 1 mounted in the dents 11 are partly brought into contact with the heat emitting fin 25a.

According to the present embodiment as has been described, the heat generated at the LED chips 1 can be removed as emitted efficiently through the heat emitting fin 25a since the heat emitting fin 25a contacting with at least part of the LED chips 1 is integrally molded with the substrate 10, whereby the temperature of the LED chips 1 can be prevented from rising, the luminous efficiency and luminance can be prevented from being deteriorated, and the life of the LED chips 1 can be prolonged.

Figure 30:
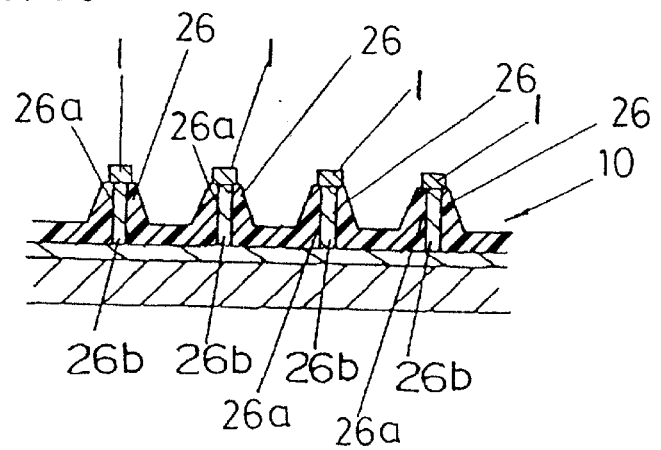

In another embodiment shown in FIG. 30 of the present invention, many protrusions 26 are disposed lengthwise and crosswise on one surface of the MID substrate 10, and the LED chips 1 are mounted respectively to top of each of these protrusions 26.

In manufacturing steps of the above substrate 10, such electrically insulating material as polyimide, polyether imide, polyamide, liquid crystal or the like is employed to form the insulative base by means of the injection molding, and the protrusions 26 are formed at mounting positions of the LED chips 1 while through holes 26a are formed within the protrusions 26.

After alkali-degreasing this insulative base, its surfaces are plasma-processed to perform the surface activation and fine roughening. Thereafter, the metal film (plating ground layer) is formed with copper, silver, gold, nickel, platinum, palladium or the like by means of the sputtering or vacuum evaporation on the surface of the insulative base. Then, the metal film at the boundary zone of the non-circuit parts 13 with respect to the circuit parts 12 is removed by the irradiation of such electromagnetic waves as laser or the like. Then an electric power is supplied to the circuit parts, and the substrate 10 is obtained in the form of a circuit substrate on which the metal film of a predetermined thickness is formed by means of electric copper plating, for example, with a copper sulfate plating bath. Thereafter heat emitting pins 26b are urged into the through holes 26a formed in the protrusions 26.

The LED chips 1 are mounted respectively onto each of the protrusions 26 of the substrate 10 thus obtained through the above process, and the circuit parts (including the heat emitting pins 26b) and the LED chips 1 are electrically joined (die-bonding) by means of an electrically conductive adhesive. Thereafter, the top electrodes of the LED chips 1 and the circuit parts are joined through metal wires (wire-bonding). By mirror-finishing peripheral slopes of the protrusions 26 on which the LED chips 1 are mounted so as to act also as reflector surfaces, it is possible to attain the high luminance and high luminous efficiency. Next, the LED chips 1 are sealed with the transparent resin, and eventually the diffuser consisting of transparent resin or the like is mounted on the mounting side surface of the substrate 10 to complete the LED luminaire module of the present embodiment.

According to the present embodiment as has been described, it is possible to remove the generated heat of the LED chips 1 as efficiently emitted by means of the heat emitting pins 26b provided within the substrate 10 below the LED chips 1 to be in contact with at least part of the LED chips 1, whereby the temperature of the LED chips 1 can be prevented from rising, the luminous efficiency and luminance can be prevented from being deteriorated, and the life of the LED chips 1 can be prolonged.

Figure 31:
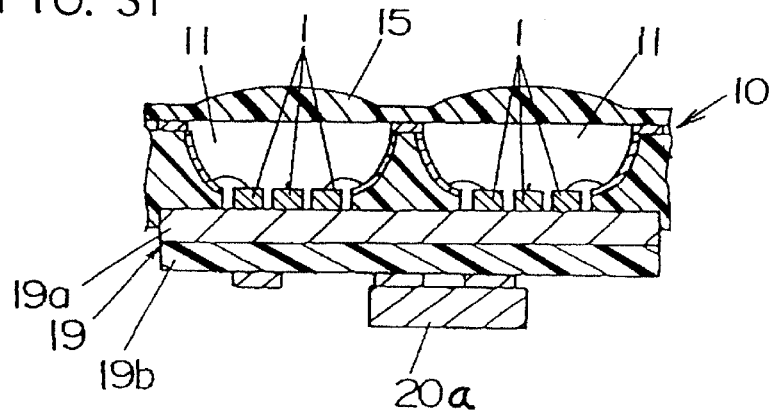

In another embodiment shown in FIG. 31 of the present invention, the luminaire is featured in that a copper clad metal element, i.e., a metal element 19 is provided on opposite side of the MID substrate 10 to the side having many of the dents 11, an electrically conductive layer 19a of this metal element 19 is made to be the ground for the LED chips 1, and a chip part 20a of such circuit elements as IC, resistors, capacitors and so on which forming a control circuit for controlling the light emission of the LED chips 1 is mounted on an insulative layer 19b of the metal element 19. For other respects of this embodiment, they are substantially the same as those in the embodiment of FIG. 1, and their description is omitted while the same constituents as those in FIG. 1 are denoted in FIG. 31 by the same reference symbols.

Next, the manufacturing steps of the substrate 10 of the present embodiment shall be briefly described. First, the insulative layer of the metal element 19 is formed in a mold through the insert injection molding. For the electrically insulating layer, similar to the embodiment of FIG. 1, polyimide, polyether imide, polyamide, liquid crystal or the like is used. After alkali-degreasing the insulative layer, its surfaces are plasma-processed to have them activated and finely roughened. Thereafter, the metal layer is formed to provide the circuit parts 12 and non-circuit parts 13, then the LED chips 1 are mounted on the conductive layer 19a of the metal element 19 exposed at the bottom of the dents 11 in the substrate 10 and are sealed with the transparent resin.

Here, in the present embodiment, the circuit (wiring pattern) for providing the control circuit is formed on the insulative layer 19b of the metal element 19, after sealing by the transparent resin the LED chips 1 mounted in the dents 11. This pattern forming process may be either one of exposure/etching process and laser patterning process which are general processes for forming printed wiring board. Then, the LED luminaire module is completed by mounting with solder the chip part 20a of such circuit elements as the IC, resistors, capacitors and so on after forming the circuit pattern.

According to the present embodiment, as has been described, the metal element 19 and LED chips 1 are brought into direct contact with each other by forming a ground with the LED chips 1 mounted to the conductive layer 19a of the copper clad metal element 19 insert-molded on the substrate 10, so that the heat generated by the LED chips 1 can be removed as efficiently emitted by the metal substrate 19, whereby the temperature of the LED chips 1 can be prevented from rising, the light emitting efficiency and luminance can be prevented from being deteriorated, and the life of the LED chips 1 can be prolonged. Further advantage can be attained in that the module can be minimized in size by mounting the circuit elements of the circuit for controlling the light emission of the LED chips 1 to the insulative layer 19b of the metal element 19, and a shielding of the circuit chip part 20 with respect to noise also can be achieved.

Figure 32:
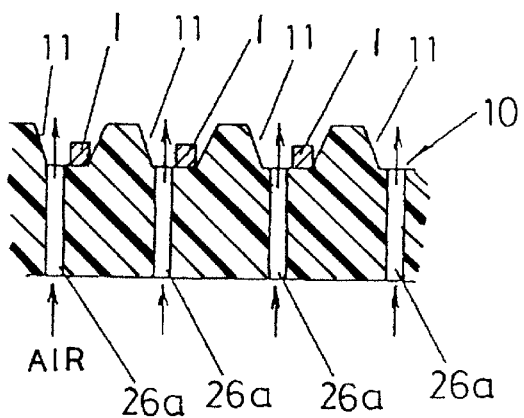

In another embodiment shown in FIG. 32 of the present invention, the luminaire is featured in that the substrate 10 having many dents 11 in one surface is provided with ventilating through holes 26a communicating the respective dents 11 mounting therein the LED chips 1 with rear surface side of the substrate 10.

The through holes 26a are formed upon molding the substrate 10 in the MID form. The following steps are the same as in the embodiment of FIG. 1, and their description is omitted here, except that the sealing with the synthetic resin is not performed after the mounting of the LED chips 1 in the dents 11 of the substrate 10.

As has been referred to, in the present embodiment, it is possible to prevent the temperature of the LED chips 1 from rising, by causing the generated heat of the LED chips to be dispersed with air current of convection, with the provision of the ventilating through holes 26a communicating the dents 11 with the rear surface side of the substrate 10, whereby the luminous efficiency and luminance of the LED chips can be prevented from being deteriorated, and the life of the chips also can be prolonged.

Figure 33:
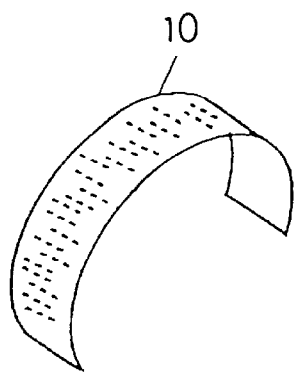
Figure 34:
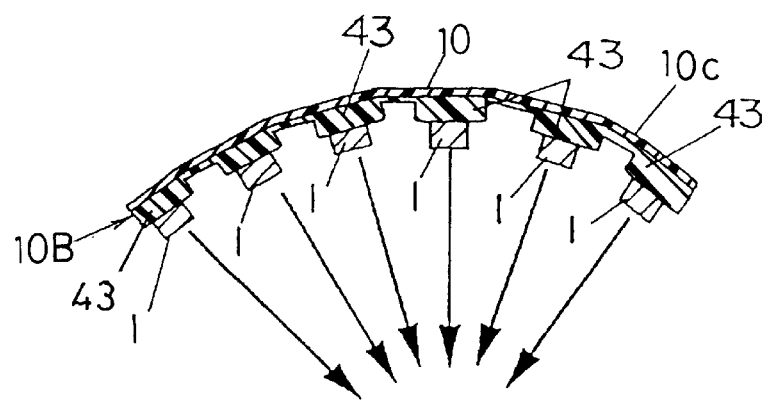
FIG. 34 is a fragmentary, schematic side view of the embodiment of FIG. 33.

In another embodiment shown in FIGS. 33 and 34 of the present invention, the luminaire is featured in that the circuit substrate 10 in the MID form to which the LED chips 1 are three-dimensionally mounted and a flexible substrate 10C are formed integral, and the substrate 10 is made as a flexible or bendable composite substrate.

Here, manufacturing steps of the substrate 10 of the present embodiment shall be described only for different respects from the embodiment of FIG. 1. The flexible substrate 10C made of polyimide on which a circuit has been preliminarily formed is put in a mold, and the flexible substrate 10C is copied on a molded article by means of an injection molding. At portions of the molded article where the LED chips 1 are mounted, thick parts, i.e., protrusions 43 are formed. Taking into account the bendability, the flexible substrate 10C is left as it is at portions between the respective thick parts 43. The sealing with the resin is also performed only in the vicinity of the LED chips 1, so that the sealing resin will not be directly bent and the whole substrate will be still rendered easily bendable. The thus molded substrate is alkali-degreased and, thereafter, the same steps as in the embodiment of FIG. 1 are performed to complete the substrate 10.

According to the present embodiment as has been described in the above, it is made possible to render the three dimensional circuit substrate 10 to be flexible and bendable and to easily vary the light distribution characteristic by integrally forming the substrate 10 on which the LED chips 1 are mounted with the flexible substrate 10C and constituting the substrate 10. In addition, the luminaire can be easily mounted to a housing or the like of the luminaire without using any screw or the like, by utilizing the flexibility of the substrate 10.

Figure 35:
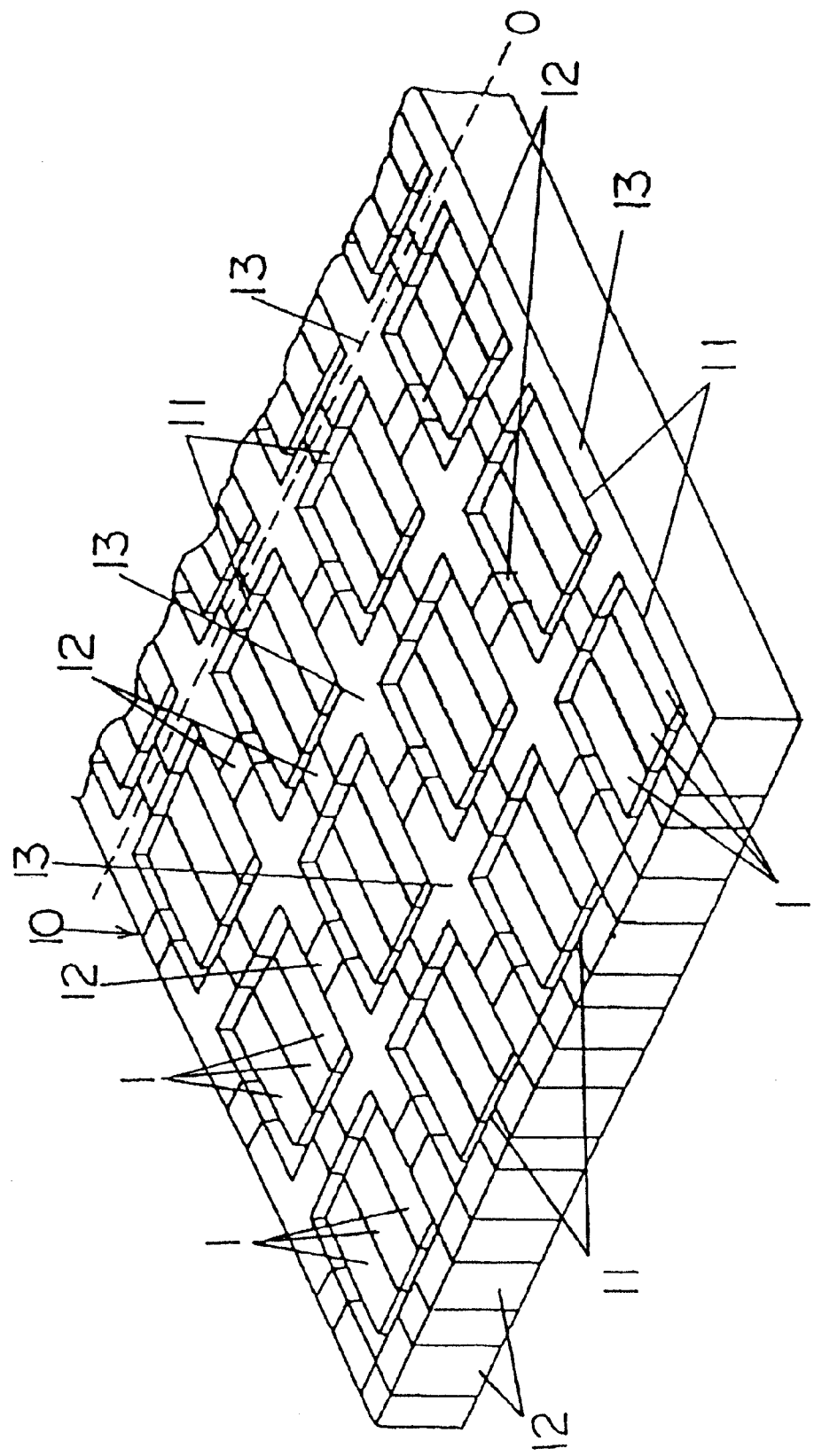
FIG. 35 is a schematic perspective view, similar to FIG. 1, of another embodiment of the present invention.

In another embodiment as shown in FIG. 35 of the present invention, the luminaire is featured in that the substrate 10 in the respective dents 11 of which a plurality of the LED chips 1 are mounted as in the embodiment of FIG. 1 can be freely cut along line "O" into every dimensional unit containing a predetermined number of the LED chips 1. Basic constituents of the substrate 10 and so on are substantially the same as those in the embodiment of FIG. 1, and their description is omitted here by denoting the same constituents as those in FIG. 1 with the same reference symbols in FIG. 35.

Figure 36:
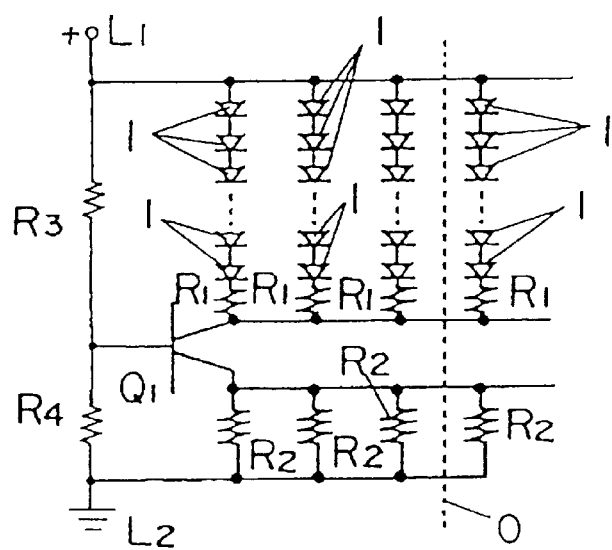
FIG. 36 is a fragmentary circuit diagram of the embodiment of FIG. 35.

As shown in FIG. 36, the circuit of the present embodiment is constituted such that a predetermined number of the LED chips 1 mounted on the substrate 10 are connected in series, such series circuits are respectively connected, through resistors R1, between a power source line L1 and the collector of a switching element Q1, the emitter of this switching element Q1 is connected through a resistor R2 to a ground line L2, and the base of the switching element Q1 is connected through resistors R3 and R4 respectively to the power source line L1 and ground line L2. Across the power source line L1 and ground line L2, a direct current voltage DC is applied.

Then, the substrate 10 is made for easy cutting at proper cutting position "O" between the respective series circuits of the LED chips 1, so as to be a unit with required number of the LED chips 1. Here, the number of the LED chips 1 for each unit should correspond to an output, likewise the fluorescent lamp which is formed with a lamp tube corresponding to the output (10, 15, 20 and 30 W), to be convenient in handling. Further, the substrate 10 should preferably be provided with grooves for rendering it to be easily cut. Since the manufacturing steps of the substrate 10 are the same as those in the embodiment of FIG. 1, their description is omitted here.

According to the present embodiment as has been described, there are brought about such advantages that the substrate 10 can be used as cut into a dimension allowing a required intensity of illumination to be obtained since the substrate can be freely cut in any dimensional unit containing a predetermined number of the LED chips 1, so as to be highly efficient, and that the substrate 10 can be manufactured at a large unit enough for decreasing manufacturing costs.

According to the present embodiment, in particular, at least either the dent or the protrusion is formed in a plurality and one or a plurality of the light emitting diode element is provided with respect to each dent or protrusion, and there are advantages that an optional light distribution can be obtained and the luminaire can be made thinner.

Figure 37:
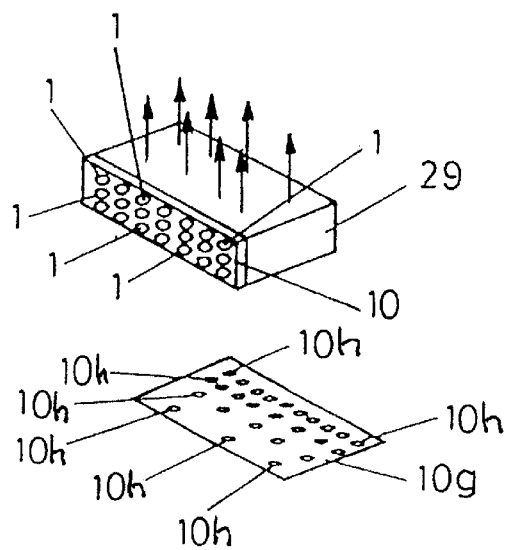
FIG. 37 is a schematic perspective view as disassembled of another embodiment of the present invention.

In another embodiment shown in FIG. 37 of the present invention, the luminaire is constituted by disposing the substrate 10 to which the LED chips 1 are mounted and resin-sealed on one side surface of a light guiding 29 made with acrylic resin into a rectangular parallelopiped as the optical control means.

The light guiding 29 has a reflection pattern sheet 10g on which a reflection pattern 10h is printed, as disposed on another side surface intersecting at right angles the one side surface on which the substrate 10 is disposed. Further, the substrate 10 is provided as covered by a reflector plate (not shown) so that the light from the LED chips 1 will be efficiently incident inside the light guiding 29. The reflection pattern sheet 10g is formed by printing the reflection pattern 10f with white color for performing an optional distribution of light, while the reflection pattern 10f of circular marks will be coarse on the side closer to the substrate 10 but dense on the side separated from the substrate 10.

Accordingly, the light emitted from the LED chips 1 is made incident into the light guiding 29 and, through multiple reflection on the reflection pattern 10f and so on, radiated out of the side surface opposing the reflection pattern sheet 10g, as shown by arrows. Here, as the light is caused to perform the multiple reflection inside the light guiding 29 to be of uniform distribution of luminance, and it is enabled to prevent any non-uniform luminance of the LED chip 1 from occurring.

The reflection pattern 10f may even be directly printed on the surface of the light guiding 29 or may be replaced by any other means than the printing, such as a grooving work or the like, suitable for an irregular reflection. In this case, the light is radiated out of both side surface of the light guiding 29, and the emission efficiency can be improved.

Further, the light guiding 29 may also be formed integral with the substrate 10 by means of the sealing resin for sealing the surface of the substrate 10. Further, while the LED chips 1 may be monochromatic, it is possible to employ a plurality of types of the LED chips 1 different in the luminous color, in which event the light blending is easier and an optional color of light can be obtained.

In the present embodiment as in the above, the light distribution control can be attained by the light guiding 29 per se, so that an image of the light source disappears, it is made unnecessary for the color blending to control the emitted light of the respective LED chips one by one, and there arises an advantage that any other optical control means than the light guiding 29 can be omitted.

Figure 38:
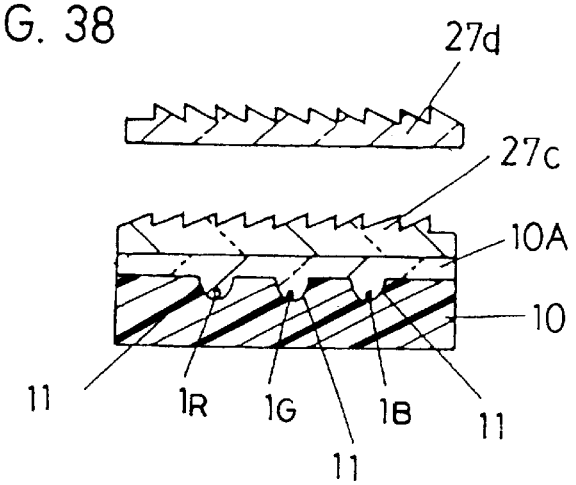
FIGS. 38–40 are fragmentary, schematic sectioned views respectively of further embodiments of the present invention.

In another embodiment shown in FIG. 38 of the present invention, the optical control means is made movable in contrast to the foregoing optical control means disposed stationary in the embodiments of FIGS. 33–37. That is, the LED luminaire 30 is constituted with the substrate 10, LED chips 1R, 1G and 1B of red, green and blue and disposed in each dent 11b formed in the substrate 10, molded layer 10A for the sealing, prism lens plate 27c acting as a stationary optical control means for the light distribution control, and further prism lens plate 27d of the same configuration and disposed rotatable in a plane parallel with the substrate 10 and in front of the stationary prism lens plate 27c.

With the further prism lens plate 27d rotated, is possible to control the distribution of light as a whole of the LED chips 1R, 1G and 1B arranged on the substrate 10, to have the state of color blending varied. At this time, the LED chips 1 may be monochromatic.

Further, while in the embodiment of FIG. 38 only one of the two prism lens plates 27c and 27d is made rotatable, it is possible to dispose both of them rotatable. Further, it is also possible to form the optical control means with a single movable prism lens plate.

Figure 39:
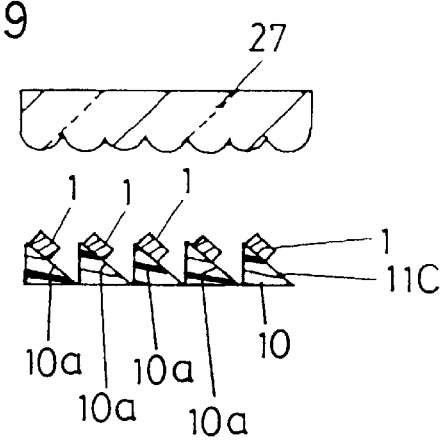

In another embodiment shown in FIG. 39 of the present invention, the luminaire is so formed that the substrate 10 is provided with a plurality of parallel rows of sloped side surfaces 10a of the protrusions substantially of a right angled triangle in section, the LED chips 1 are disposed on sloped side surface of the respective sloped side faces 10a to control the distribution of light of the LED chips 1 at the stage of their mounting, and microlens plate 27 is disposed rotatable in the plane parallel to the substrate 10 in front of the LED chips, the lens being thus single here.

Thus, in the present embodiment, at least one of the movable optical control means such as the prism lens plate 27c is employed, so that the distribution of light can be optionally varied by actuating the optical control means, and the user is allowed to easily perform the light distribution control desired at installed position of the luminaire. Therefore, the illumination appliance incorporating this LED luminaire 30 is not required to be changed in its direction when the distribution of light is modified.

Figure 40:
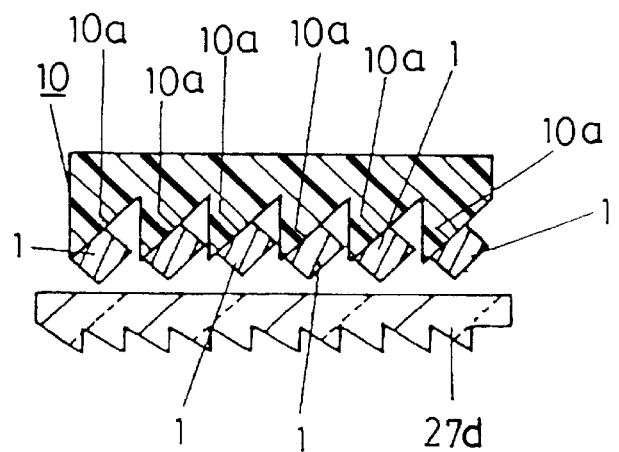

In another embodiment shown in FIG. 40 of the present invention, the luminaire is formed for controlling also the direction of the light distribution, by controlling the mounting direction of the LED chips 1 by means of the substrate 10 which comprises an MID substrate which is moldable into the three dimensional configuration, whereby a precise light distribution control is enabled as combined with such optical control means as the prism lens plate 27d.

In the above, the resin material for use as the MID substrate may be any resin material, while such one desirably excellent in the electrical properties or in heat emission properties as the liquid crystal polymer is employed in the present embodiment. Further, the substrate is formed in the three-dimensional configuration having the protrusions of the right angled triangle in section similar to the embodiment of FIG. 38, so as to be able to mount the LED chips 1 in the direction of light distribution, and the sloped side surface 10a of such protrusion is used as the mounting surface.

According to the present invention as has been described, generally, the substrate is provided with at least either of the dents and protrusions, and one or a plurality of the LED chip or chips is disposed with respect to each of the dents or protrusions, so that the optional distribution of light can be easily attained and the luminaire can be thinned, as will be readily appreciated.

What is claimed is:

1. An LED luminaire comprising:
    a resin molded substrate provided at least on one surface thereof with light distribution control means for controlling the distribution of light in a desired direction and with a wiring circuit in a desired pattern, and
    a plurality of LED chips mounted at least on the one surface of the substrate respectively and connected to the wiring circuit and in correspondence to the light distribution control means and wiring circuit,
    wherein the light distribution control means comprises at least one uneven surface of the substrate and wherein the LED chips are mounted on the uneven surface with each LED chip having a p-n junction plane disposed substantially in conformity to the desired direction of the light distribution, the uneven surface of the substrate including a plurality of holes penetrating through the substrate from the one surface to the other, and the LED chips are mounted respectively in each of the through holes with the p-n junction planes disposed in conformity to penetrating direction of the holes.

2. The luminaire according to claim 1 wherein the uneven surface of the substrate comprises a paraboloid formed as a light reflecting surface which concentrates the emission direction of the respective LED chips to the desired direction, and the LED chips are mounted on the paraboloid with the p-n junction plane disposed substantially perpendicularly to the paraboloid.

3. The luminaire according to claim 1 wherein the uneven surface of the substrate comprises projections provided to surround the mounting position of each LED chip and forming slopes facing toward each LED chip, the wiring circuit extending across the projections and along the slopes provides a light reflecting surface, and the LED chips are mounted at the mounting position with their projection planes disposed substantially perpendicular with respect to the surface of the substrate surrounded by the projections to be in conformity to the desired direction of the light distribution.

4. The luminaire according to claim 1 wherein the uneven surface of the substrate comprises a multilayered protrusion in one of stepwise and spiral staircase shapes which sequentially protruding from a peripheral part to a central part of the substrate and the LED chips are mounted on flat parts of the protrusion with their p-n junction planes disposed substantially perpendicular with respect to the flat parts of the protrusion.

5. The luminaire according to claim 1 wherein the uneven surface of the substrate is provided also on the other surface of the substrate together with the light distribution control means and wiring circuit.

6. The luminaire according to claim 1 wherein the uneven surface of the substrate comprises a plurality of dents respectively for mounting therein each of the LED chips with their p-n junction planes disposed substantially perpendicular with respect to inner bottom faces of the dents and the respective dents have on their inner surfaces a fluorescent substance layer of a luminous color for obtaining desired luminous color of the luminaire as mixed with the luminous color of each LED chip.

7. The luminaire according to claim 1 wherein the uneven surface of the substrate is formed as a whole in a concave surface including a plurality of protrusions, and the LED chips are respectively mounted on each of the protrusions with their p-n junction planes disposed substantially perpendicular with respect to the concave substrate.

8. An LED luminaire comprising:
    a resin molded substrate provided at least on one surface e thereof with means for controlling the distribution of light in a desired direction and with a wiring circuit in a desired pattern, and
    a plurality of LED chips mounted at least on said one surface of the substrate respectively as connected to the wiring circuit and in correspondence to the light distribution control means and wiring circuit;
    wherein the light distribution control means comprises an uneven surface provided at least to said one surface of the substrate, the surface having the wiring circuit and the LED chips mounted thereon, and
    wherein the uneven surface comprises an undulated surface saw-toothed in section, the saw-toothed surface including slopes on which the LED chips are mounted and which are angled for leading the direction of emission of at a predetermined number of the LED chip to a desired direction.

9. The luminaire according to claim 8 wherein the slopes of the saw-toothed undulated surface are at a fixed angle for leading the emission direction to be mutually parallel to be in a single direction.

10. The luminaire according to claim 8 wherein the slopes of the saw-toothed undulated surface are angled as sequentially varied for concentrating the emission direction of the respective LED chips to a desired direction.

11. An LED luminaire comprising a plurality of LED chips, a substrate on which the plurality of LED chips are mounted, and a light control means provided to the substrate for controlling the distribution of light emitted by the respective LED chips, the light control means including at least one of a plurality of dents and a plurality of protrusions formed at positions where the LED chips are mounted and comprising the substrate per se formed with a light transmitting material, wherein the LED chips are respectively provided with a power-supplying electrode section made of a transparent conductor.

12. An LED luminaire comprising:
    a resin molded substrate provided at least on one surface thereof with light distribution control means for controlling the distribution of light in a desired direction and with a wiring circuit in a desired pattern, and a plurality of LED chips mounted at least on the one surface of the substrate respectively and connected to the wiring circuit and in correspondence to the light distribution control means and wiring circuit, wherein the light distribution control means comprises at least one uneven surface of the substrate and wherein the LED chips are mounted on the uneven surface with each LED chip having a p-n junction plane disposed substantially in conformity to the desired direction of the light distribution, the light distribution control means comprising a first light distribution plate including the uneven surface of the substrate and a second light distribution plate including a prism lens plate disposed rotatable on a plane parallel to the substrate in front of the first light distribution plate.

13. An LED luminaire comprising:

a resin molded substrate provided at least on one surface thereof with light distribution control means for controlling the distribution of light in a desired direction and with a wiring circuit in a desired pattern, and a plurality of LED chips mounted at least on said one surface of the substrate respectively as connected to the wiring circuit and in correspondence to the light distribution control means and wiring circuit, wherein the light distribution control means comprises an uneven surface of a transparent resin layer, the uneven surface being disposed outer than the LED chips with respect to the substrate, the light distribution control means comprising a first light distribution plate that comprises a transparent resin layer having the uneven surface and a second light distribution plate of a prism lens plate disposed in parallel to the substrate in front of the first light distribution plate at least the second light distribution plate being rotatable on a plane parallel to the substrate.

* * * * *